(12) United States Patent
Sun et al.

(10) Patent No.: US 10,976,774 B2
(45) Date of Patent: Apr. 13, 2021

(54) ELECTRONIC DEVICE, TERMINAL DEVICE, AND METHOD FOR CONTROLLING ELECTRONIC DEVICE

(71) Applicant: Guangdong Oppo Mobile Telecommunications Corp., Ltd., Guangdong (CN)

(72) Inventors: Zhigang Sun, Guangdong (CN); Zanjian Zeng, Guangdong (CN); Guoan Zhou, Guangdong (CN); Xiang Zhang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/365,958

(22) Filed: Mar. 27, 2019

(65) Prior Publication Data

US 2019/0302841 A1 Oct. 3, 2019

(30) Foreign Application Priority Data

Mar. 31, 2018 (CN) .......................... 201810282608.6

(51) Int. Cl.
*G06F 1/16* (2006.01)
*H05K 1/02* (2006.01)
(Continued)

(52) U.S. Cl.
CPC .......... *G06F 1/1624* (2013.01); *G06F 1/1626* (2013.01); *G06F 1/1637* (2013.01);
(Continued)

(58) Field of Classification Search
CPC ............. H04M 1/0235; H04M 1/0237; H04M 1/0266; H04M 1/0264; H04M 1/0245;
(Continued)

(56) References Cited

U.S. PATENT DOCUMENTS

2003/0064688 A1* 4/2003 Mizuta ................ H04M 1/0237
455/90.2
2007/0273786 A1* 11/2007 Ahn .................... H01M 2/1022
348/373
(Continued)

FOREIGN PATENT DOCUMENTS

CN 102138113 A 7/2011
CN 101355756 B 10/2012
(Continued)

OTHER PUBLICATIONS

Extended European search report issued in corresponding European application No. 19165502.6 dated May 24, 2019.
(Continued)

*Primary Examiner* — George Eng
*Assistant Examiner* — Jing Gao

(57) ABSTRACT

An electronic device is provided. The electronic device includes a frame, a sliding seat, a guiding mechanism, a drive mechanism, and multiple functional components accommodated in the sliding seat. The frame includes a pair of side walls oppositely disposed and a top wall. The top wall defines an accommodating groove. The accommodating groove extends through the pair of side walls. The sliding seat is slidably connected with the frame in the accommodating groove via the drive mechanism, and the guiding mechanism is disposed between the sliding seat and the frame, whereby the sliding seat driven by the drive mechanism extends from or is accommodated in the accommodating groove along a guiding direction of the guiding mechanism. The sliding seat is provided with at least one functional portion, whereby the multiple functional components are able to transmit a signal through the at least one functional portion.

13 Claims, 17 Drawing Sheets

(51) Int. Cl.
*H04M 1/02* (2006.01)
*H04M 1/03* (2006.01)

(52) U.S. Cl.
CPC .......... *G06F 1/1683* (2013.01); *G06F 1/1686* (2013.01); *G06F 1/1698* (2013.01); *H04M 1/026* (2013.01); *H04M 1/0237* (2013.01); *H04M 1/03* (2013.01); *H05K 1/028* (2013.01)

(58) Field of Classification Search
CPC .. H04M 1/026; H04M 1/0268; H04M 1/0272; H04M 1/03; G06F 1/1624; G06F 1/1626; G06F 1/1637; G06F 1/1686; G06F 3/0488
See application file for complete search history.

(56) References Cited

U.S. PATENT DOCUMENTS

| | | | |
|---|---|---|---|
| 2009/0323292 | A1 | 12/2009 | Hwang et al. |
| 2010/0124955 | A1* | 5/2010 | Lin .................... H04M 1/0237 455/575.4 |

FOREIGN PATENT DOCUMENTS

| CN | 203251333 U | 10/2013 |
|---|---|---|
| CN | 204031223 U | 12/2014 |
| CN | 105208149 A | 12/2015 |
| CN | 105453526 A | 3/2016 |
| CN | 105554196 A | 5/2016 |
| CN | 105630079 A | 6/2016 |
| CN | 205320124 U | 6/2016 |
| CN | 105842959 A | 8/2016 |
| CN | 106094990 A | 11/2016 |
| CN | 106657456 A | 5/2017 |
| CN | 106713549 A | 5/2017 |
| CN | 106790801 A | 5/2017 |
| CN | 106856516 A | 6/2017 |
| CN | 107071242 A | 8/2017 |
| CN | 206413083 U | 8/2017 |
| CN | 107197133 A | 9/2017 |
| CN | 107370843 A | 11/2017 |
| CN | 206960841 U | 2/2018 |
| CN | 107800828 A | 3/2018 |
| CN | 107800828 A * | 3/2018 |
| CN | 207926660 U | 9/2018 |
| EP | 1528758 A1 | 5/2005 |
| EP | 3255867 A1 | 12/2017 |

OTHER PUBLICATIONS

International search report issued in corresponding international application No. PCT/CN2019/079534 dated Jun. 26, 2019.
English translation of First office action issued in corresponding CN application No. 201810282608.6 dated Jun. 19, 2020.
Communication pursuant to Article 94(3) EPC issued in corresponding European application No. 19165502.6 dated Jul. 20, 2020.
OA2 with English Translation issued in corresponding CN application No. 201810282608.6 dated Jan. 5, 2021.

* cited by examiner

ELECTRONIC DEVICE, TERMINAL DEVICE, AND METHOD FOR CONTROLLING ELECTRONIC DEVICE

CROSS-REFERENCE TO RELATED APPLICATION(S)

This application claims priority to Chinese Patent Application No. 201810282608.6, filed on Mar. 31, 2018, the entire disclosure of which is hereby incorporated by reference.

TECHNICAL FIELD

This disclosure relates to the field of electronic apparatuses, and more particularly to an electronic device, a terminal device, and a method for controlling an electronic device.

BACKGROUND

With development of science and technology and requirements of markets, screens of electronic apparatuses are getting increasingly larger. A screen-to-body ratio of an electronic apparatus is restricted by functional components. For example, install and arrangement of a camera module, a receiver module, a flashlight, a sensor, and the like may restrict improvement of the screen-to-body ratio of the electronic apparatus. In the related art, a high screen-to-body ratio of the electronic apparatus is usually achieved by decreasing sizes of the functional components, which can result in high cost.

SUMMARY

An electronic device with flexible arrangement, a terminal device, and a method for controlling an electronic device are provided in the present disclosure.

In a first aspect of the present disclosure, an electronic device is provided.

The electronic device includes a frame, a sliding seat, a guiding mechanism, a drive mechanism, and multiple functional components. The multiple functional components are accommodated in the sliding seat. The frame includes a pair of side walls which are oppositely disposed and a top wall of side walls. The top wall defines an accommodating groove, and the accommodating groove extends through the pair of side walls. The sliding seat is slidably connected with the frame in the accommodating groove via the drive mechanism, and the guiding mechanism is disposed between the sliding seat and the frame, whereby the sliding seat driven by the drive mechanism extends from or is accommodated in the accommodating groove along a guiding direction of the guiding mechanism. The sliding seat is provided with at least one functional portion, whereby the multiple functional components are able to transmit (or deliver) a signal.

In a second aspect of the present disclosure, a terminal device is provided.

The terminal device includes an electronic device and a display module. The electronic device includes a frame, a sliding seat, a guiding mechanism, a drive mechanism, and multiple functional components. The multiple functional components are accommodated in the sliding seat. The frame includes a pair of side walls which are oppositely disposed and a top wall which is connected between the pair of side walls. The top wall defines an accommodating groove, and the accommodating groove extends through the pair of side walls. The sliding seat is slidably connected with the frame in the accommodating groove via the drive mechanism, and the guiding mechanism is disposed between the sliding seat and the frame, whereby the sliding seat driven by the drive mechanism extends from or is accommodated in the accommodating groove along a guiding direction of the guiding mechanism. The sliding seat is provided with at least one functional portion, whereby the multiple functional components are able to transmit a signal through the at least one functional portion. The display module covers the frame and is disposed opposite the sliding seat.

In a third aspect of the present disclosure, a method for controlling an electronic device is provided. The method is applicable to an electronic device. The electronic device includes a frame, a sliding seat, a guiding mechanism, a drive mechanism, and multiple functional components, and the multiple functional components are accommodated in the sliding seat. The frame includes a pair of side walls which are oppositely disposed and a top wall. The top wall defines an accommodating groove, and the accommodating groove extends through the pair of side walls. The sliding seat is slidably connected with the frame in the accommodating groove via the drive mechanism, and the guiding mechanism is disposed between the sliding seat and the frame, whereby the sliding seat driven by the drive mechanism extends from or is accommodated in the accommodating groove along a guiding direction of the guiding mechanism. The sliding seat is provided with at least one functional portion, whereby the multiple functional components are able to transmit a signal through the at least one functional portion.

The method includes the following. The electronic device receives a preset signal, where the preset signal is an extension signal or a retraction signal. When the preset signal is the extension signal, the electronic device controls the drive mechanism to drive the sliding seat to extend from the accommodating groove along a guiding direction of the guiding mechanism according to the preset signal. When the preset signal is the retraction signal, the electronic device controls the drive mechanism to drive the sliding seat to retract into the accommodating groove along the guiding direction of the guiding mechanism according to the preset signal.

BRIEF DESCRIPTION OF DRAWINGS

To describe technical solutions in implementations of the present disclosure more clearly, the following briefly introduces the accompanying drawings required for describing the implementations. Apparently, the accompanying drawings in the following description illustrate some implementations of the present disclosure. Those of ordinary skill in the art may also obtain other drawings based on these accompanying drawings without creative efforts.

DETAILED DESCRIPTION

Technical solutions in implementations of the present disclosure will be described clearly and completely hereinafter with reference to the accompanying drawings in the implementations of the present disclosure. Apparently, the described implementations are merely some rather than all implementations of the present disclosure. All other implementations obtained by those of ordinary skill in the art based on the implementations of the present disclosure without creative efforts shall fall within the protection scope of the present disclosure.

It should be understood that, in the implementations of the present disclosure, directional relationship or positional relationship indicated by such terms as "thickness" is based on the directional relationship or the positional relationship illustrated in the accompanying drawings and is merely for convenience of description and simplicity, rather than explicitly or implicitly indicates devices or elements referred to herein must have a certain direction or be configured or operated in a certain direction and therefore should not be understood as limitation on the disclosure.

Implementations of the disclosure provide an electronic device 100. The electronic device 100 can be any electronic apparatus. Examples of the electronic apparatus include smart apparatuses such as a tablet computer, a mobile phone, a camera, a personal computer (PC), a notebook computer, an in-vehicle apparatus, a wearable apparatus, or the like. For convenience of description, directions of the electronic device 100 are defined with reference to a viewing angle illustrated in FIG. 1: a width direction of the electronic device 100 is defined as X-direction, a length direction of the electronic device 100 is defined as Y-direction, and a thickness direction of electronic device 100 is defined as Z-direction.

Figure 1:
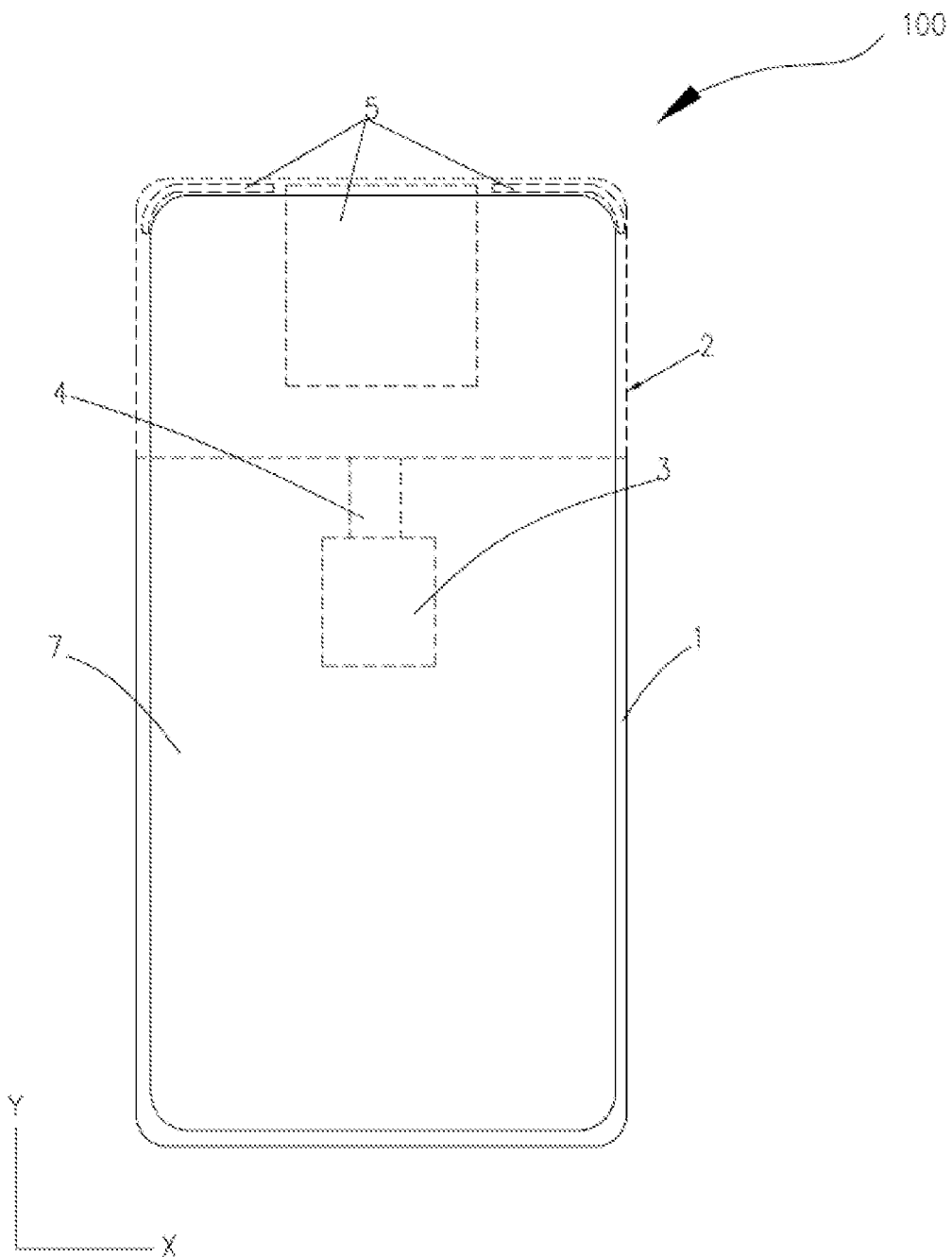
FIG. 1 is a schematic diagram illustrating an electronic device in a retracting-state according to Implementation 1 of the present disclosure.

FIG. 1 is the electronic device 100 according to Implementation 1 of the present disclosure. The electronic device 100 mainly includes a frame 1 and a sliding seat 2. The sliding seat 2 is slidably connected with the frame 1 to enable the electronic device 100 to make the sliding seat 2 extend from or retract into the frame 1 according to actual needs of a user. Multiple functional components 5 are accommodated in the sliding seat 2. The sliding seat 2 can slide relative to the frame 1 to enable the multiple functional components 5 to slide out when the multiple functional components 5 are needed to work, thereby avoiding restriction on a screen-to-body ratio of a display screen of the electronic device 100 resulting from use of the multiple functional components 5, which is beneficial to improving the screen-to-body ratio of the electronic device 100.

Figure 2:
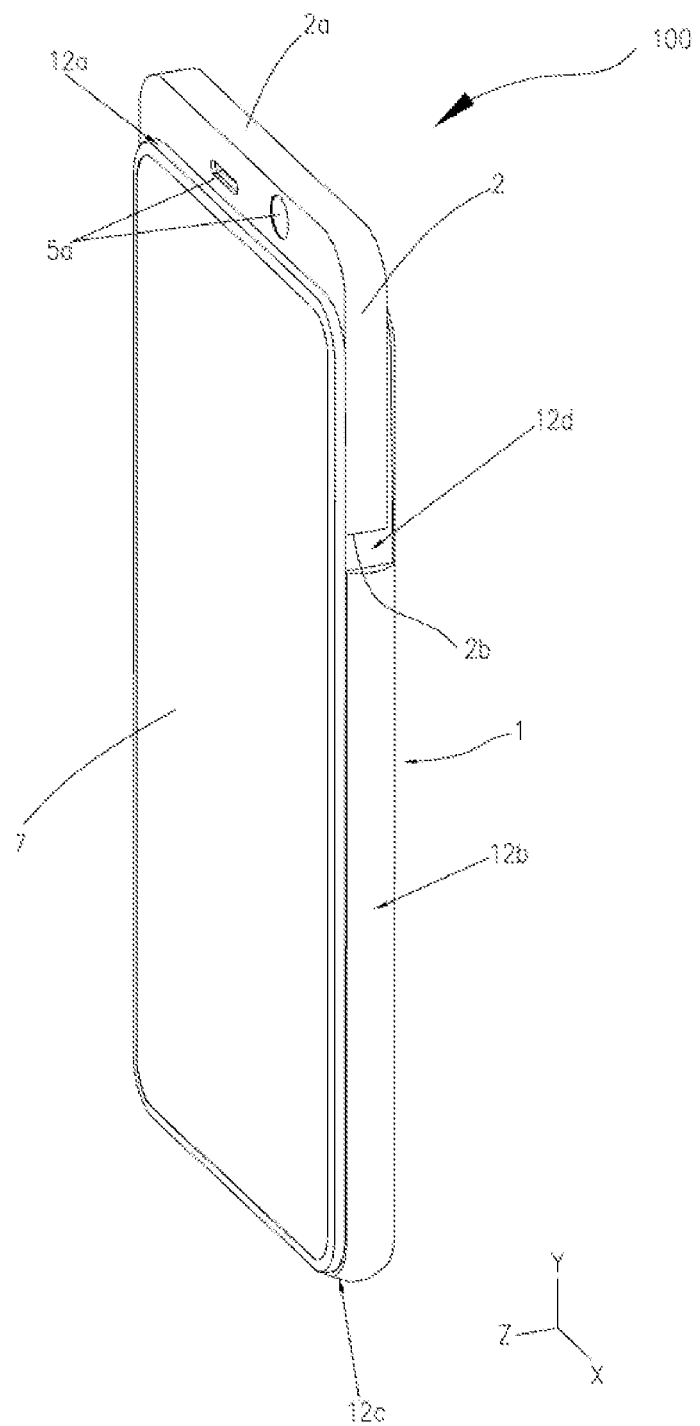
FIG. 2 is a schematic diagram illustrating the electronic device of FIG. 1 in an extending-state.

As illustrated in FIG. 1, the electronic device 100 in the implementations of the disclosure includes the frame 1, the sliding seat 2, a guiding mechanism 4, a drive mechanism 3, and the multiple functional components 5 received in the sliding seat 2. As illustrated in FIG. 2, the frame 1 includes a pair of side walls 12b which are oppositely disposed and a top wall 12a which is connected between the pair of side walls 12b. The top wall 12a defines an accommodating groove 12d. The accommodating groove 12d extends through the pair of side walls 12b. Referring to FIG. 1 and FIG. 2, the sliding seat 2 is slidably connected with the frame 1 in the accommodating groove 12d via the drive mechanism 3. The guiding mechanism 4 is disposed on the sliding seat 2, whereby the sliding seat 2 driven by the drive mechanism 3 extends from or is accommodated in the accommodating groove 12d along a guiding direction of the guiding mechanism 4. The sliding seat 2 is provided with at least one functional portion 5a, through which the multiple functional components 5 are able to transmit a signal.

By disposing the multiple functional components 5 in the sliding seat 2 and enabling the sliding seat 2 to slide relative to the frame 1, when the multiple functional components 5 are needed to work, the drive mechanism 3 can drive the sliding seat 2 to slide out of the frame 1 to make the functional portion 5a extend from the frame 1 to transmit a signal(s), that is, there is no need to dispose the at least one functional portion 5a corresponding to the multiple functional components 5 on the display screen of the electronic device 100, which can improve the screen-to-body ratio of the electronic device 100. In addition, the guiding mechanism 4 can make the sliding seat 2 keep sliding along a pre-determined path when the sliding seat 2 slides relative to the frame 1, thereby ensuring accuracy and stability when the sliding seat 2 slides.

In the electronic device 100, the top wall 12a of a side frame member 12 defines the accommodating groove 12d, and in this way, the display screen (or a display module 7), the sliding seat 2, and a middle plate 11 of the electronic device 100 form a sandwich structure when the sliding seat 2 is slidably connected with the frame 1. Such a structure guarantees that the display screen and the middle plate 11 can protect the sliding seat 2 inside against crashing when the electronic device 100 drops or is collided by an external force.

Figure 3:
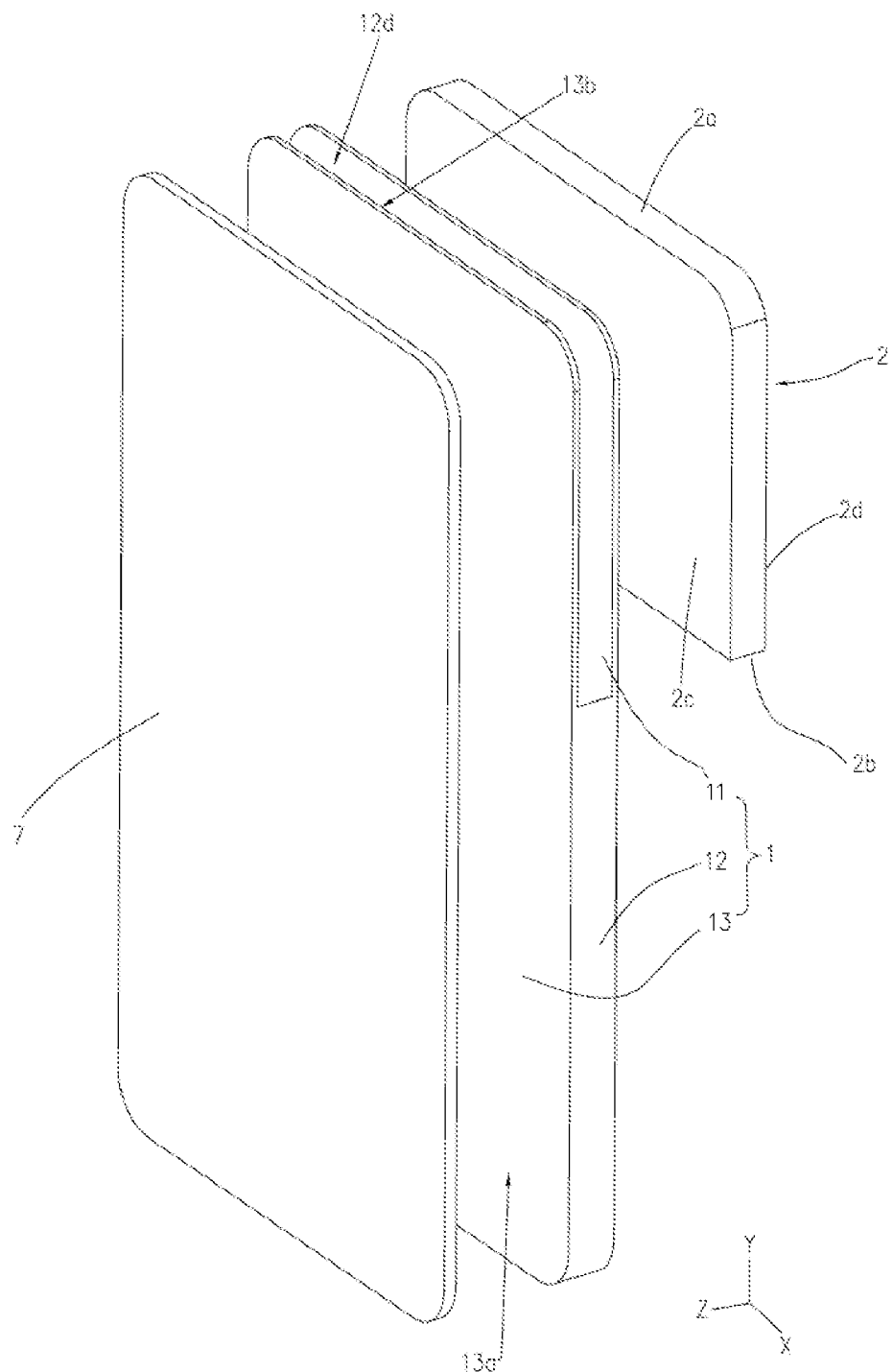
FIG. 3 is a schematic exploded view illustrating the electronic device illustrated in FIG. 2.

As illustrated in FIG. 3, the frame 1 includes the middle plate 11 and the side frame member 12 surrounding the middle plate 11. The side frame member 12 is configured to cover (understood as substantially cover and engage) the display screen to form a complete housing of the electronic device 100. As illustrated in FIG. 2, the middle plate 11 includes the pair of side walls 12b which are oppositely disposed and the top wall 12a and a bottom wall 12c which are connected with the pair of side walls 12b. That is to say, the middle plate 11 is substantially in a rectangular shape. The pair of side walls 12b are also long sides of the electronic device 100. In general, the pair of side walls 12b are configured to arrange a volume button, a card base, and the like of the electronic device 100. The top wall 12a and the bottom wall 12c are short sides of the electronic device 100. Generally, the bottom wall 12c is configured to arrange an earpiece, a speaker, and the like of the electronic device 100.

For the convenience of understanding, refer to FIG. 3. Space inside the frame 1 except the accommodating groove 12d is defined as an inner cavity of the frame 1, that is, the accommodating groove 12d and the inner cavity define a complete inner space of the frame 1.

As illustrated in FIG. 3, a length of the accommodating groove 12d along the X-direction is equal to a length of the frame 1 along the X-direction. In other words, part of the pair of side walls 12b, which is adjacent to the top wall 12a, defines two openings due to existence of the accommodating groove 12d, such that the sliding seat 2 corresponding to the accommodating groove 12d has a larger volume to accommodate more functional components 5. Correspondingly, as the number of functional components 5 of the sliding seat 2 increase, effect on the screen-to-body ratio of the display screen of the electronic device 100 will be reduced.

As illustrated in FIG. 3, the sliding seat 2 has a size corresponding to the accommodating groove 12d, that is, the sliding seat fills in the whole accommodating groove 12d. The sliding seat 2 has a first wall 2a and a second wall 2b which are arranged opposite to each other in Y-direction. Referring to FIG. 2, when the first wall 2a of the sliding seat 2 extends from the top wall 12a for a certain distance, the sliding seat 2 is completely extended from the frame 1. That is to say, the sliding seat 2 is in an extending-state. Referring to FIG. 1, when the first wall 2a of the sliding seat 2 is flush with the top wall 12a, the sliding seat 2 is completely accommodated in the accommodating groove 12d. That is to say, the sliding seat 2 is in a retracting-state.

Referring to FIG. 2, when one of the multiple functional components 5 is needed to work, the sliding seat 2 can be moved out to make the sliding seat 2 be in the extending-state. In this case, one of the at least one functional portion 5a of the sliding seat 2 is no longer occluded by the display screen. Said one of the multiple functional components 5 corresponding to said one of the at least one functional portion 5a can transmit a signal to the outside. For example, the multiple functional components 5 can include a front-facing camera component. A front-facing camera is a common feature of cameras, mobile phones, smartphones, and tablets. Tablets and smartphones and similar mobile devices have their front-facing camera on the front to allow taking a self-portrait photograph or video while looking at the display of the device, usually showing a live preview of the image. Front-facing cameras are therefore an important development for videotelephony and the taking of selfies. Accordingly, the functional portion 5a corresponding to the front-facing camera component is a front-facing light-transmitting portion which can transmit light to the front-facing camera component. Referring to FIG. 2, when a front-facing camera function is needed to work, slide the sliding seat 2 to make the sliding seat 2 be in the extending-state, such that a camera function (such as taking pictures) of the front-facing camera component can be achieved via the front-facing light-transmitting portion. Referring to FIG. 1, when there is no need to use the front-facing camera, slide the sliding seat 2 to make the sliding seat 2 be in the retracting-state, which facilitates accommodation of the electronic device 100.

It can be understood that, as illustrated in FIG. 2, the at least one functional portion 5a of the sliding seat 2 corresponds to different functional components 5, and accordingly the at least one functional portion 5a is able to transmit different signals. Exemplarily, the functional portion 5a corresponding to a camera assembly 51 is able to transmit light signals, the functional portion 5a corresponding to a receiver (i.e. voice receiver) 52 is able to transmit sound signals, and so on.

Referring to FIG. 2 and FIG. 3, the functional portion 5a of the sliding seat 2 is mainly disposed on a first sliding surface 2c and a second sliding surface 2d which are disposed opposite to each other on the sliding seat 2 in the Z-direction. The arrangement of the functional portion 5a on the sliding surfaces of the sliding seat 2 varies with the functional component 5 to which the functional portion 5a corresponds.

Figure 4:
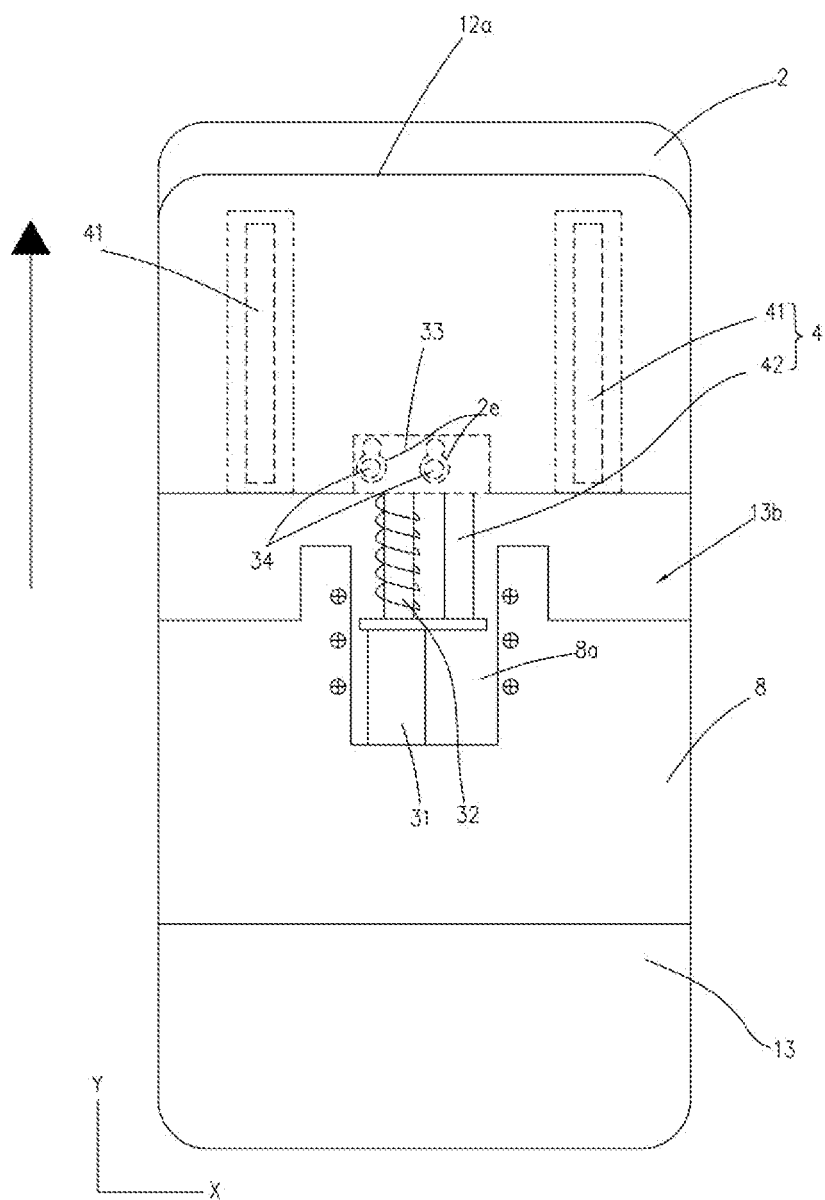
FIG. 4 is a schematic diagram illustrating a drive mechanism of the electronic device in the extending-state according to Implementation 1 of the present disclosure.

As illustrated in FIG. 4, the drive mechanism 3 is fixed to the inner cavity of the frame 1 and connected with the sliding seat 2, to drive the sliding seat 2 to slide relative to the frame 1.

Figure 6:
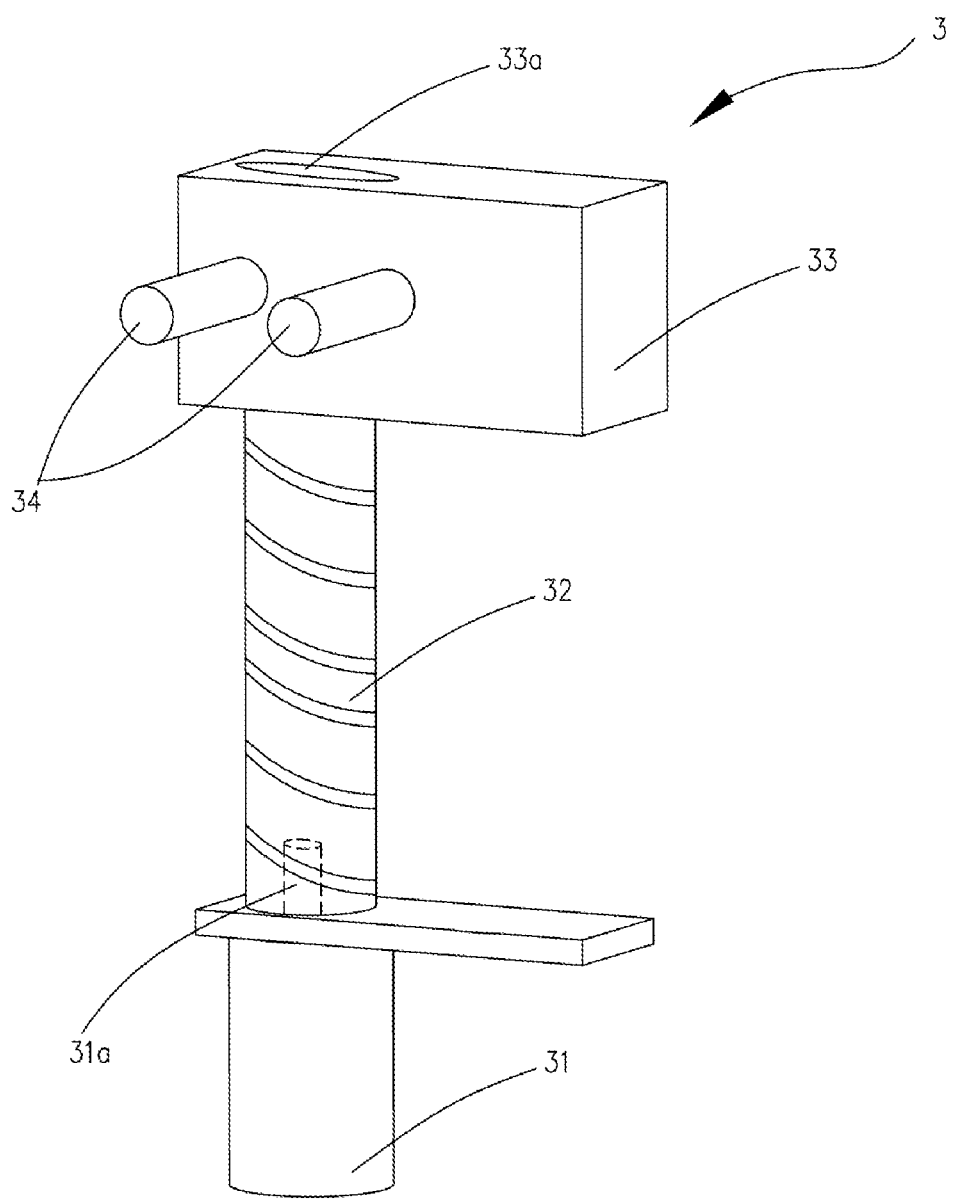
FIG. 6 is a schematic diagram illustrating the drive mechanism of the electronic device illustrated in FIG. 4.

Referring to FIG. 4 and FIG. 6, the driving mechanism 3 includes a motor 31, an active rod 32, and a drive block 33 which are fixed in the frame 1. The active rod 32 has one end fixedly connected to a rotating shaft 31a of the motor 31. The drive block 33 is in a driving connection with the active rod 32 and is connected with the sliding seat 2, so that the drive block 33 drives the sliding seat 2 to slide when the motor 31 rotates.

Referring to FIG. 6, the driving manner of the drive mechanism 3 is to convert a rotational motion of the motor 31 into a rectilinear motion. The active rod 32 is a screw rod. The drive block 33 is block-shaped and has a threaded hole 33a which matches the active rod 32. The motor 31 rotates to drive the screw rod to slide relative to the drive block 33 connected with the sliding seat 2, to achieve sliding of the sliding seat 2. Driving of the drive mechanism 3 is steady, which guarantees that the sliding seat 2 of large volume can slide smoothly relative to the frame 1.

As illustrated in FIG. 4, the motor 31 is fixedly disposed in the inner cavity of the frame 1, and the motor 31 is vertically disposed in the frame 1. In other words, the rotating shaft 31a of the motor 31 is parallel to the Y-direction of the electronic device 100, and such a disposing manner of the motor 31 guarantees that a size of the motor 31 in the X-direction is small, which facilitates arrangement of components of the electronic device 100 in the X-direction. The active rod 32 has one end fixedly connected with the rotating shaft 31a of the motor 31. The drive block 33 is sleeved on the active rod 32. When the motor 31 rotates, the active rod 32 rotates accordingly. In this case, since the drive block 33 is in threaded connection with the screw rod, the drive block 33 can move in the Y-direction of the electronic device 100, thereby driving the sliding seat 2 connected with the drive block 33 to move in the Y-direction, to enable the sliding seat 2 to extend from or retract into the accommodating groove 12d.

Different rotation directions of the motor 31 result in different movement directions of the drive block 33. For instance, as illustrated in FIG. 4, when the motor 31 rotates forward, the drive block 33 slides towards the top wall 12a of the frame 1 to make the sliding seat 2 extend from the accommodating groove 12d. On the contrary, as illustrated in FIG. 5, the drive block 33 slides away from the top wall 12a of the frame 1 to make the sliding seat 2 retract into the accommodating groove 12d.

The sliding seat 2 has a large volume and thus a large number of the functional components 5 can be received therein, which increases weight of the sliding seat 2 to some extent and further affect the stability and accuracy of sliding of the sliding seat 2. However, in the related art, generally no sliding seat 2 is provided due to failure to overcome such influence of the weight of the sliding seat 2 on the stability and accuracy of sliding. Even if the sliding seat 2 is provided, few functional components 5 can be accommodated in the sliding seat 2. In the present disclosure, in order to solve the above technical problem, the guiding mechanism 4 is provided between the sliding seat 2 and the frame 1. Such guiding mechanism 4 can effectively ensure the stability and accuracy when the sliding seat 2 of such a large volume slides.

Figure 5:
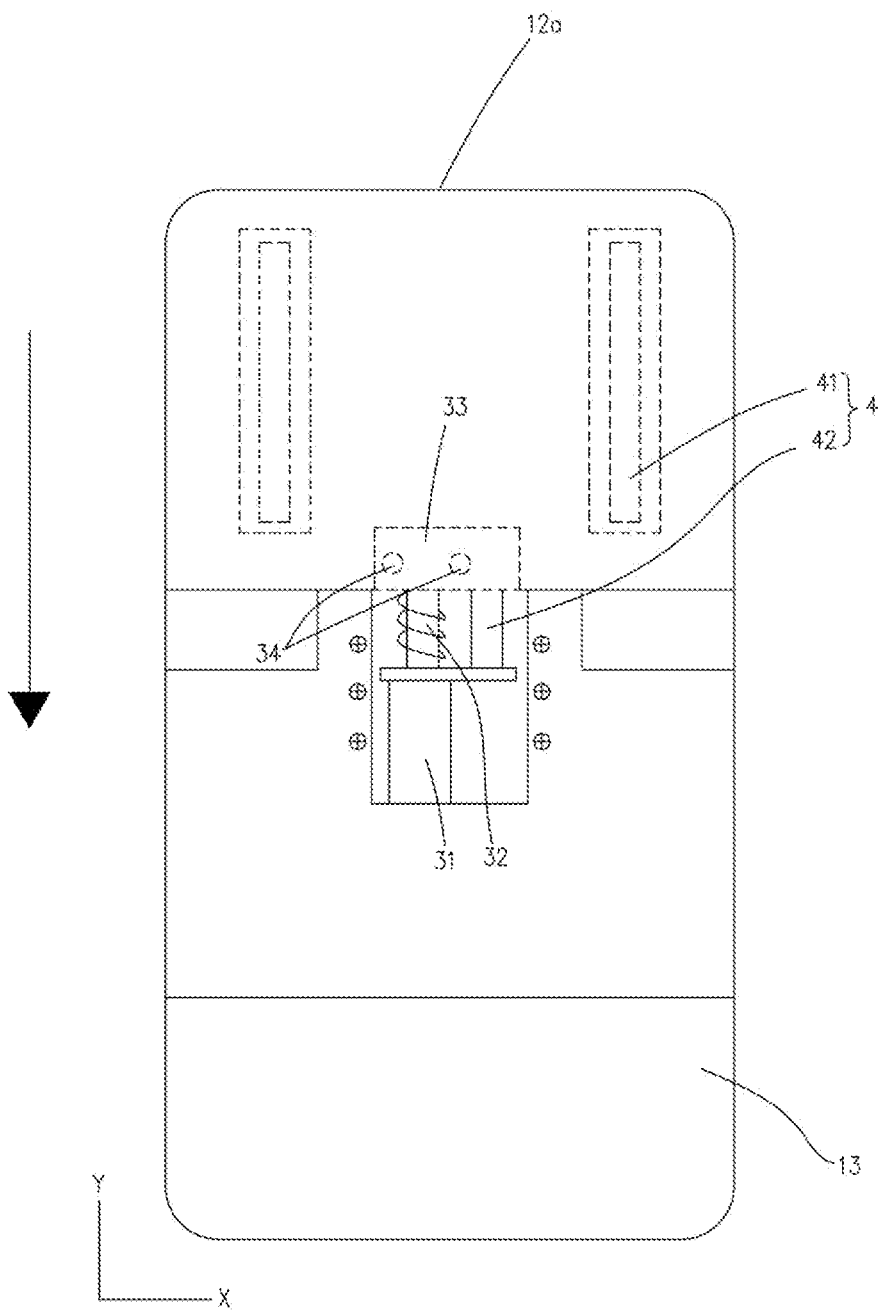
FIG. 5 is a schematic diagram illustrating the electronic device of FIG. 4 in the retracting-state.

Referring to FIG. 4 and FIG. 5, the guiding mechanism 4 can be configured as but not limited to the following. The electronic device 100 further includes a support plate 13. The support plate 13 covers the frame 1. The guiding mechanism 4 includes at least one sliding rail 41 and a guiding rod 42. The at least one sliding rail 41 is disposed on the support plate 13. The sliding seat 2 is slidably connected with the at least one sliding rail 41. The guiding rod 42 has one end fixed in the frame 1 and the other end which can slide relative to the sliding seat 2. The guiding rod 42 extends in a longitudinal direction parallel to a longitudinal direction of the sliding rail 41.

The guiding mechanism 4 is a combination of the sliding rail 41 and the guiding rod 42. On one hand, the sliding rail 41 can make the sliding seat 2 slide in a pre-determined direction, thereby ensuring accuracy of sliding of the sliding seat 2. On the other hand, volume of the sliding seat 2 is large, the size of the sliding seat 2 in the X-direction is the same as the size of the frame 1 in the X-direction, the guiding rod 42 can support and guide the sliding seat 2 when the sliding seat 2 slides, and therefore, the sliding seat 2 can slide steadily and accurately relative to the frame 1 because of the guiding mechanism 4, thereby further improving reliability of the electronic device 100.

As illustrated in FIG. 3, the support plate 13 covers the side frame member 12. The support plate 13 includes a first support surface 13a and a second support surface 13b which are oppositely disposed. The first support surface 13a is configured to carry the display module 7. The second support surface 13b is configured to support the sliding seat 2. The support plate 13 can be integrated with the side frame member 12. Alternatively, the support plate 13 and the side frame member 12 can be detachable structures. For example, the support plate 13 is fixed to the side frame member 12 via a screw, riveting, or the like. In this way, the accommodating groove 12d is located between the support plate 13 and the middle plate 11. Correspondingly, the first sliding surface 2c of the sliding seat 2 is attached to the support plate 13, and the second sliding surface 2d of the sliding seat 2 is attached to the middle plate 11.

Referring to FIG. 4, the support plate 13 is provided with two sliding rails 41. One of the two sliding rails 41 is disposed close to one of the side walls 12b of the frame 1, and the other one of the two sliding rails 41 is disposed close to the other one of the side walls 12b of the frame 1. Correspondingly, sliding blocks corresponding to the sliding rails 41 are protruded and disposed on the sliding seat 2 to enable the sliding seat 2 to be slidably coupled with the sliding rails 41 via the sliding blocks.

It can be understood that, a cross section of the sliding rail 41 and a cross section of the sliding block form a dovetail shape.

It can be understood that, as illustrated in FIG. 4, the motor 31 of the drive mechanism 3 is fixed to the support plate 13.

It can be understood that, as illustrated in FIG. 4, the guiding rod 42 is configured as follows. One guiding rod 42 is provided. The foregoing one guiding rod 42 is disposed adjacent to the drive mechanism 3 and has one end fixed to the drive mechanism 3.

The guiding rod 42 is disposed adjacent to the drive mechanism 3. Since these two components are densely arranged, sizes of the drive mechanism 3 and the guiding rod 42 in the X-direction can be further reduced.

Referring to FIG. 4 and FIG. 5, the guiding rod 42 has one end fixed to the motor 31 and the other end slidably connected with the drive block 33. That is to say, the one guiding rod 42 passes through the drive block 33. As the drive block 33 slides correspondingly as the active rod 32 rotates, the drive block 33 also slides corresponding to the one guiding rod 42. The guiding rod 42 can support the drive block 33 connected with the sliding seat 2, thus preventing the sliding seat 2 from tilting due to uneven stress applied to the drive block 33 by the sliding seat 2, and preventing the sliding seat 2 from tilting; tilting of the sliding seat 2 will result in lower stability and accuracy of sliding of the sliding seat 2, which prevents the sliding seat 2 from moving out of the accommodating groove 12d and retracting into the accommodating groove 12d smoothly during sliding and thus causes the sliding seat 2 collide with a groove-wall of the accommodating groove 12d. Therefore, the present scheme can improve reliability of the electronic device 100.

It can be understood that, the connection between the drive block 33 and the active rod 32 includes but is not limited to the following.

In one implementation, the drive block 33 is fixedly connected with the active rod 32. The drive block 33 is fixedly connected with the sliding seat 2 via a screw. As such, when the drive block 33 slides, the sliding seat 2 slides accordingly.

In another implementation, referring to FIG. 4 and FIG. 6, the sliding seat 2 defines at least one connecting hole 2e. The drive mechanism 3 further includes at least one connecting rod 34. The at least one connecting rod 34 has one end fixed to the drive block 33 and the other end passing through the connecting hole 2e of the sliding seat 2. A central axis of the connecting rod 34 is perpendicular to the support plate 13 to make the sliding seat 2 slide relative to the connecting rod 34.

The connection between the sliding seat 2 and the drive mechanism 3 makes degree of freedom of the sliding seat 2 and degree of freedom of the connecting rod 34 in the Z-direction of the electronic device 100 not restricted. In this way, the sliding seat 2 can conduct self-adaptive adjustment in the Z-direction during sliding to avoid a situation where the sliding seat 2 is unable to slide due to being stuck with the drive mechanism 3, which improves reliability of the electronic device 100.

As illustrated in FIG. 4, two connecting holes 2e are provided. A central axis of the connecting hole 2e is parallel to the Z-direction. Correspondingly, as illustrated in FIG. 6, two connecting rods 34 are provided. The connecting rod 34 is substantially a pin. The connecting rod 34 has one end fixed to the drive block 33 and the other end passing through the connecting hole 2e, and the other end of the connecting rod 34 is unable to fall out of the connecting hole 2e, which guarantees the connection relationship between the sliding seat 2 and the drive block 33. In addition, part of the connecting rod 34 located in the connecting hole 2e and the connecting hole 2e are spaced apart, such that the sliding seat 2 can slide relative to the drive block 33 in the Z-direction, that is, degree of freedom of the sliding seat 2 and degree of freedom of the connecting rod 34 in the Z-direction of the electronic device 100 are not restricted, whereby the sliding seat 2 can be self-adaptive adjusted in the Z-direction during sliding, to avoid a situation where the sliding seat 2 is unable to slide due to being stuck with the drive mechanism 3, which improves reliability of the electronic device 100.

Referring to FIG. 4, the electronic device 100 switches to the extending-state from the retracting-state as follows. When the motor 31 rotates, the screw rod rotates and drives the drive block 33 to slide towards the top wall 12a of the frame 1, thereby driving the sliding seat 2 to extend gradually from the accommodating groove 12d until the electronic device 100 is in the extending-state. Here, since degree of freedom of the drive block 33 and degree of freedom of the sliding seat 2 in the Z-direction are not restricted, the sliding seat 2 can conduct self-adaptive adjustment in the Z-direction.

In the above process, the guiding mechanism 4 restricts the sliding seat 2 to a pre-determined direction.

As illustrated in FIG. 5, the electronic device 100 switches to the retracting-state from the extending-state as follows. When the motor 31 rotates, the screw rod rotates and drives the drive block 33 to slide away from the top wall 12a of the frame 1, thereby driving the sliding seat 2 to retract gradually into the accommodating groove 12d until the electronic device 100 is in the retracting-state. Here, since the degree of freedom of the drive block 33 and the degree of freedom of the sliding seat 2 in the Z-direction are not restricted, the sliding seat 2 can conduct self-adaptive adjustment in the Z-direction.

In the above process, the guiding mechanism 4 restricts the sliding seat 2 to a pre-determined direction.

Figure 7:
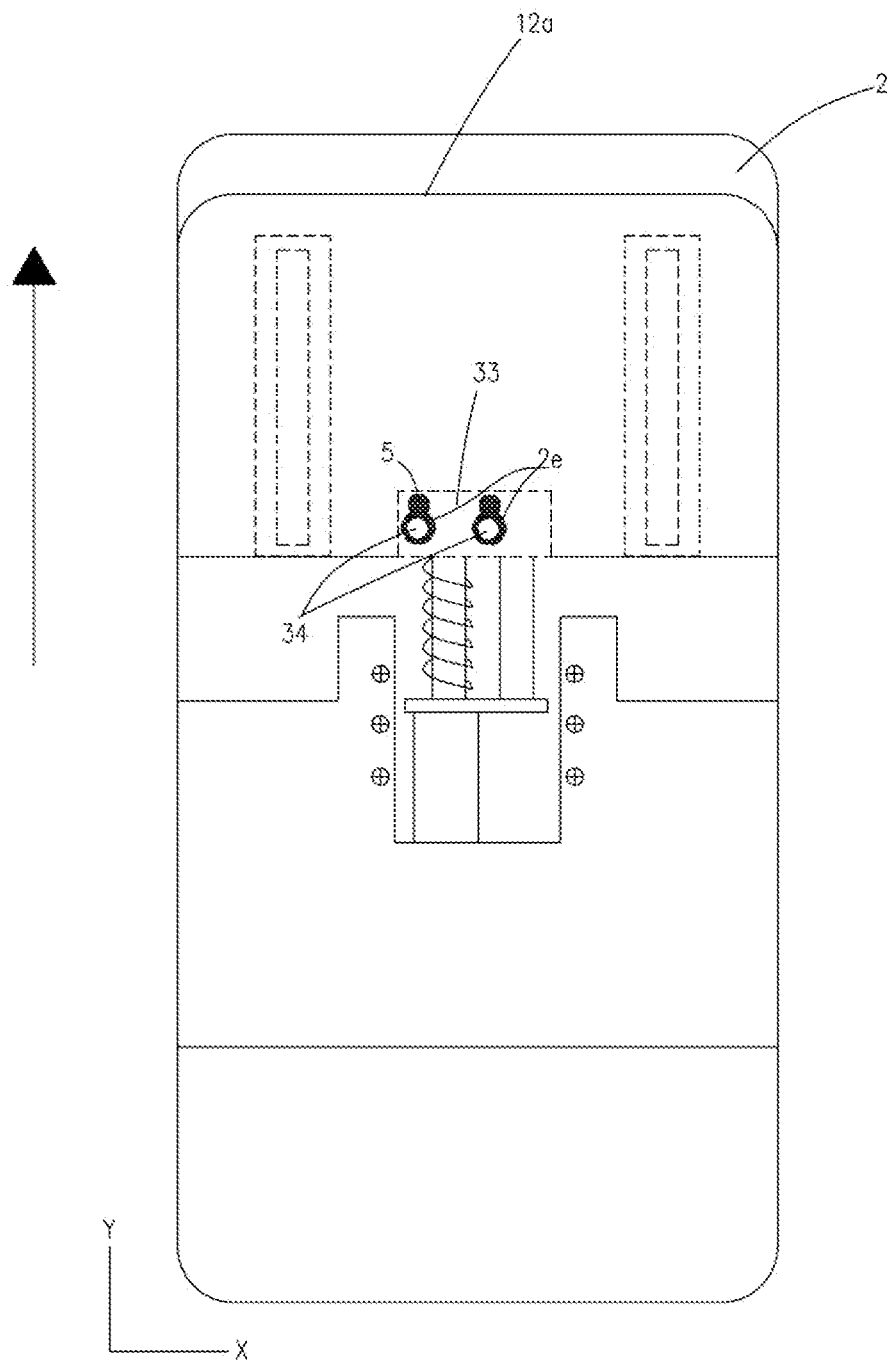
FIG. 7 a schematic diagram illustrating a buffer member further provided for the electronic device illustrated in FIG. 4.

In addition, as illustrated in FIG. 7, the electronic device 100 further includes a buffer member 5. The buffer member 5 is located in the connecting hole 2e and abuts against the connecting rod 34 and a hole-wall of the connecting hole 2e. The buffer member 5 can absorb at least part of force transmitted to the drive mechanism 3 from the sliding seat 2 when the sliding seat 2 is subject to an external force.

The buffer member 5 includes but is not limited to the following.

In one implementation, the buffer member 5 is made of silica gel and is sleeved on part of the connecting rod 34 located in the connecting hole 2e.

The connecting hole 2e includes a small hole and a big hole which are connected with each other and form substantially a gourd shape. Correspondingly, the buffer member 5 is also substantially in a gourd shape which corresponds to shape of the connecting hole 2e. The buffer member 5 is sleeved on a peripheral surface of the connecting rod 34.

When the electronic device 100 is subject to an impact of an external force and such impact force transmitted to the sliding seat 2 is further transmitted to the drive block 33 via the connecting rod 34, the buffer member 5 can absorb part of the impact force applied to the sliding seat 2 though elastic deformation of the buffer member 5 itself. In this way, the external force transmitted to the drive block 33 decreases accordingly, thereby avoiding effectively damage on the drive mechanism 3 and ensuring that the drive mechanism 3 works reliably, which improves reliability of the electronic device 100.

The buffer member 5 is made of rubber which is sleeved on the connecting rod 34, that is, the buffer member 5 wraps the connecting rod 34, which is beneficial to absorbing force transmitted to the connecting rod 34 from all directions. The buffer member 5 thus structured is more effective.

Figure 8:
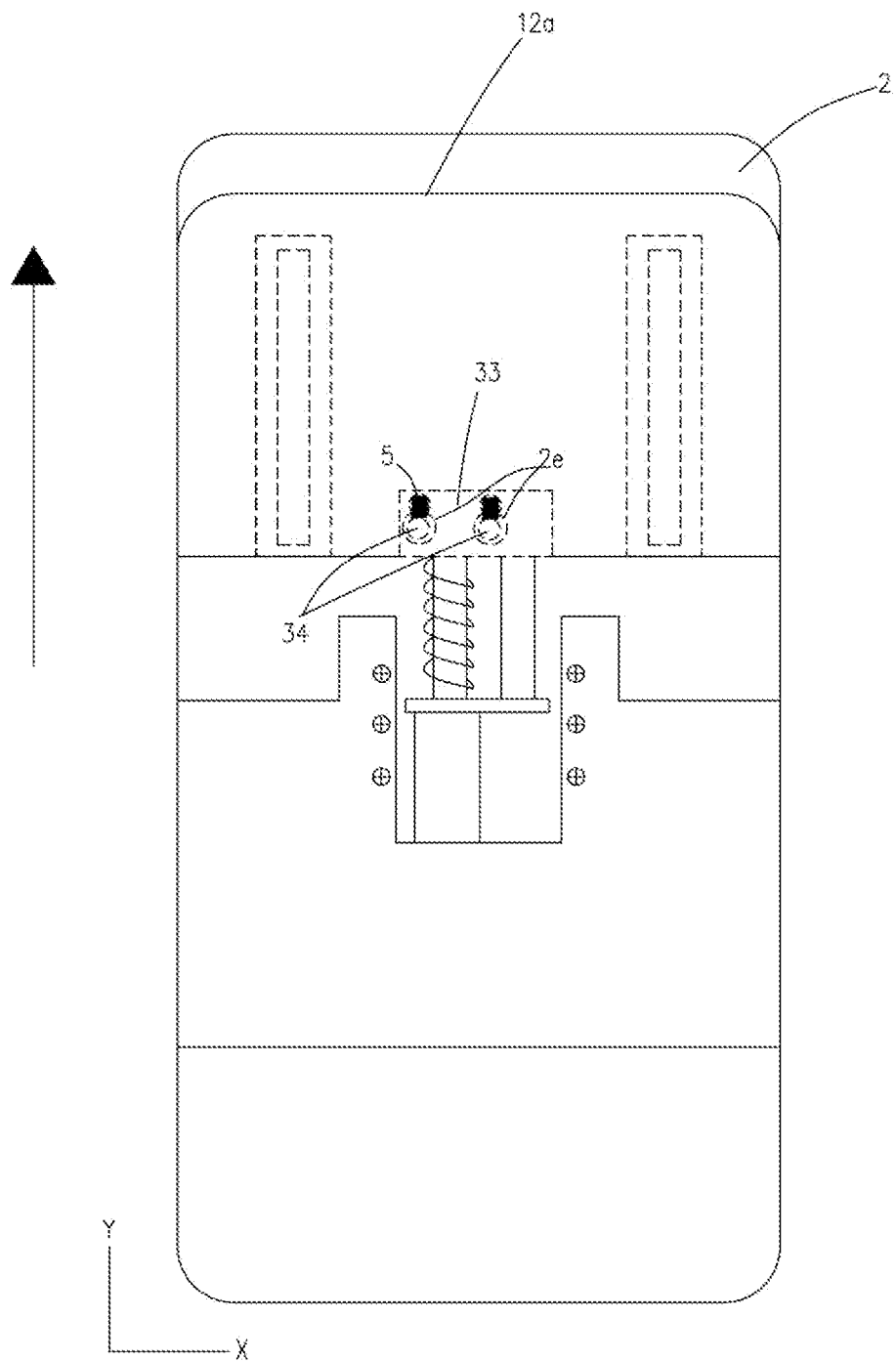
FIG. 8 a schematic diagram illustrating another buffer member further provided for the electronic device illustrated in FIG. 4.

In another implementation, as illustrated in FIG. 8, the buffer member 5 is a spring and an elastic force of the buffer member 5 is parallel to an extending direction of the sliding seat 2.

The connecting hole 2e includes a small hole and a big hole which are connected with each other and form substantially a gourd shape. The connecting rod 34 is in the big hole. The spring is a compression spring. The spring has one end abutting against a hole-wall and the other end abutting against the connecting rod 34. The elastic force of the spring is along the Y-direction.

When the electronic device 100 is subject to an impact of an external force and such impact force transmitted to the sliding seat 2 is further transmitted to the drive block 33 via the connecting rod 34, the spring can absorb part of the impact force applied to the sliding seat 2 though elastic deformation of the spring itself. In this way, the external force transmitted to the drive block 33 decreases accordingly, thereby avoiding effectively damage on the drive mechanism 3 and ensuring that the drive mechanism 3 works reliably, which improves reliability of the electronic device 100.

With aid of the buffer member 5, it is possible to protect the electronic device 100 against falling off and protect the drive mechanism 3, thereby further improving reliability of the electronic device 100.

In the electronic device 100 provided herein, the multiple functional components 5 are disposed in the sliding seat 2, and the sliding seat 2 can slide relative to the frame 1. In this way, when the multiple functional components 5 are needed to work, the drive mechanism 3 can drive the sliding seat 2 to slide out of the frame 1 to make the functional portion 5a extend from the frame 1 to transmit a signal, that is, there is no need to dispose the at least one functional portion 5a corresponding to the multiple functional components 5 on the display screen of the electronic device 100, which is beneficial to improving the screen-to-body ratio of the electronic device 100. In addition, the guiding mechanism 4 can make the sliding seat 2 keep sliding on a pre-determined path when the sliding seat 2 slides relative to the frame 1, thereby ensuring accuracy and stability of sliding of the sliding seat 2.

Figure 9:
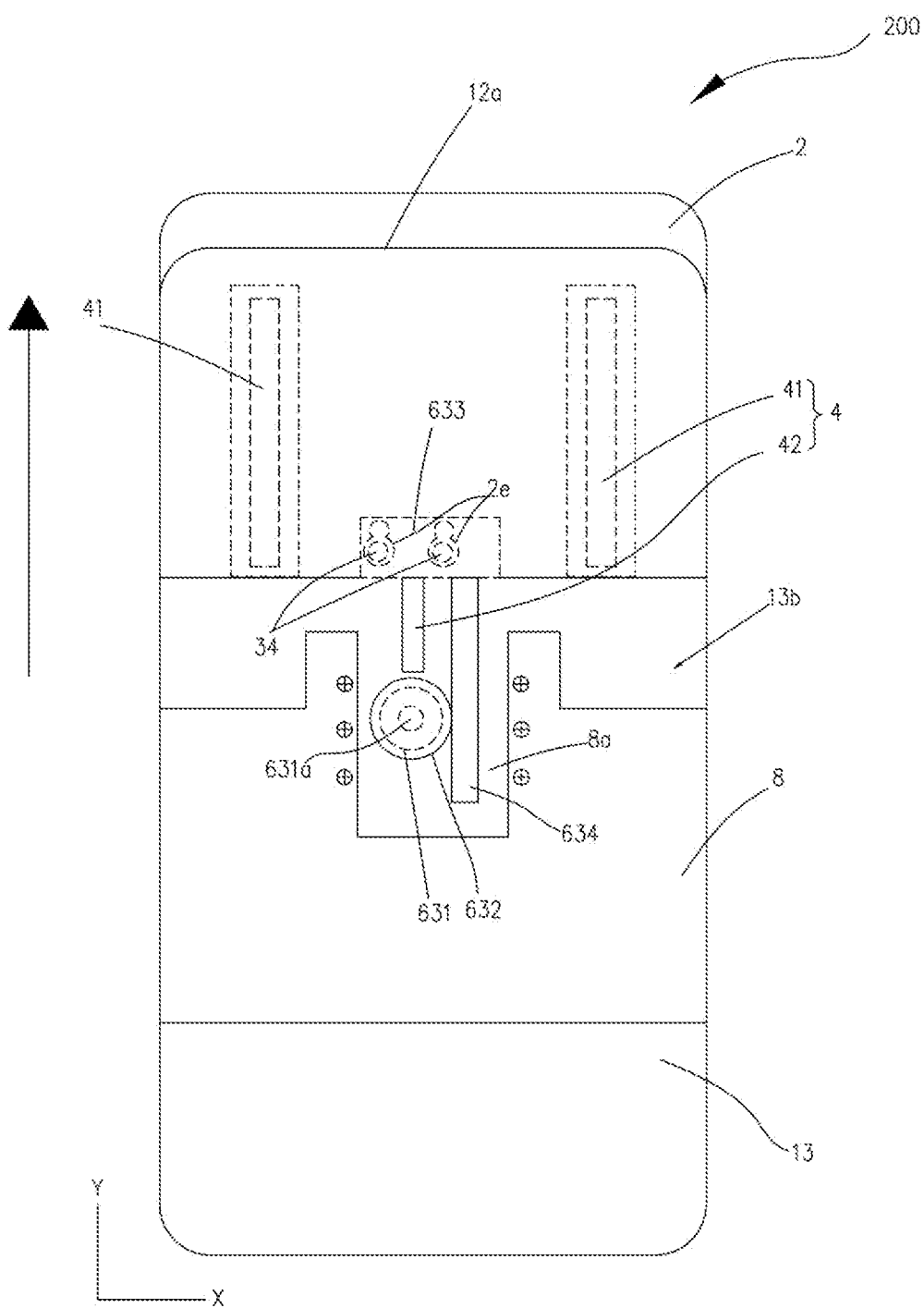
FIG. 9 is a schematic diagram illustrating another drive mechanism of an electronic device in an extending-state according to Implementation 2 of the present disclosure.

As illustrated in FIG. 9, an electronic device 200 according to Implementation 2 of the disclosure has a structure similar to that of the electronic device 100 according to Implementation 1 of the disclosure. The electronic device 200 differs from the electronic device 100 in that, the drive mechanism 63 includes a motor 631, a gear 632, a rack 634, and a drive block 633 which are fixed on the support plate 13. The gear 632 is sleeved on a rotating shaft 631a of the motor 631, the rack 634 is engaged with the gear 632, and the rack 634 is slidable in the longitudinal direction of the sliding rail 41, that is, the rack 634 can slide along the Y-direction. The drive block 633 is disposed between the rack 634 and the sliding seat 2, so that the drive block 633 can drive the sliding seat 2 to slide when the rack 634 slides, and the one guiding rod 42 has one end fixed to the motor 631 and the other end slidably connected with the drive block 633.

The driving manner of the drive mechanism 63 is to convert a rotational motion of the motor 631 into a rectilinear motion. The drive block 633 is fixedly connected with the rack 634. When the motor 631 rotates, it drives the gear 632 to rotate, and the gear 632 further drives the rack 634 engaged with the gear 632 to slide, thereby driving the drive block 633 connected with the sliding seat 2 to slide to achieve sliding of the sliding seat 2. Driving of the drive mechanism 63 is steady, which guarantees that the sliding seat 2 of large volume can slide smoothly relative to the frame 1.

As illustrated in FIG. 9, the motor 631 is fixedly disposed in the inner cavity of the frame 1, and the motor 631 is disposed horizontally in the frame 1. In other words, the rotating shaft 631a of the motor 631 is parallel to the Z-direction of the electronic device 200, and such a disposing manner of the motor 631 guarantees that the motor 631 has a small size in the X-direction, which facilitates arrangement of components of the electronic device 200 in the X-direction. It can be understood that, the motor 631 is fixed to the second support surface 13b of the support plate 13. The gear 632 is sleeved on the rotating shaft 631a of the motor 631.

Accordingly, the support plate 13 further has a sliding groove. Part of the rack 634 is located in the sliding groove, which guarantees that the rack 634 can slide along the direction of the sliding groove with sliding of the gear 632 after the rack 634 is engaged with the gear 632. Accordingly, a longitudinal direction of the sliding groove is along the Y-direction. The drive block 633 is fixed to the rack 634. When the rack 634 slides, the drive block 633 slides accordingly. When the motor 631 rotates, it drives the gear 632 to rotate. In this case, since the rack 634 is engaged with the gear 632, the rack 634 to which the drive block 633 is fixed is able to move along the Y-direction of the electronic device 200, thereby driving the sliding seat 2 to move in the Y-direction and thus enabling the sliding seat 2 to extend from or retract into the accommodating groove 12d.

Figure 10:
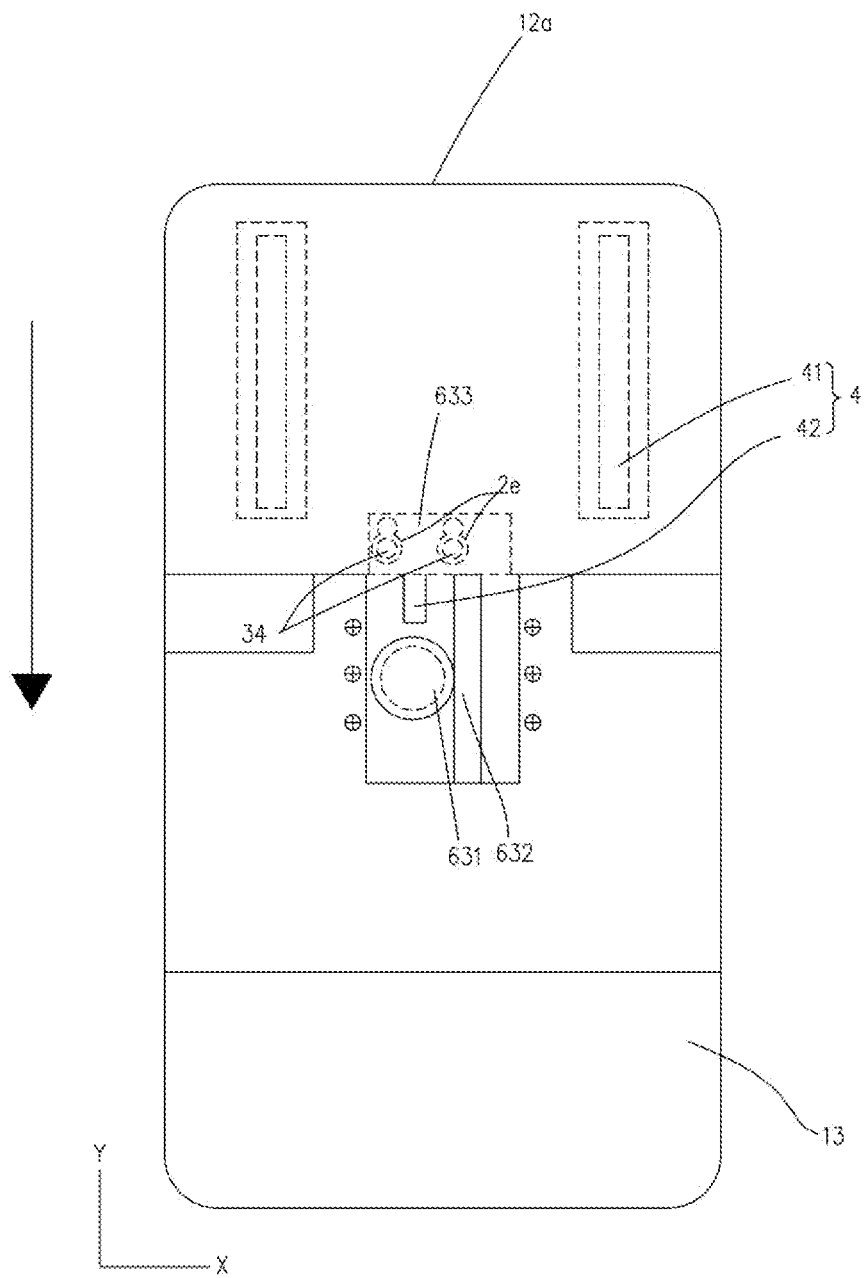
FIG. 10 is a schematic diagram illustrating the electronic device of FIG. 9 in a retracting-state.

Different rotation directions of the motor 631 result in different movement directions of the drive block 633. For instance, as illustrated in FIG. 9, when the motor 631 rotates forward, the drive block 633 slides towards the top wall 12a of the frame 1 to make the sliding seat 2 extend from the accommodating groove 12d. On the contrary, as illustrated in FIG. 10, the drive block 633 slides away from the top wall 12a of the frame 1 to make the sliding seat 2 retract into the accommodating groove 12d.

The guiding mechanism 4 of the electronic device 200 according to Implementation 2 has a same structure as the guiding mechanism 4 of the electronic device 100 according to Implementation 1. The difference mainly lies in changes of a structure of the drive mechanism 63 and changes of connection between some components of the guiding mechanism 4 and some components of the drive mechanism 63, which will be described in detail hereinafter.

Referring to FIG. 9, the guiding rod 42 has one end fixed to the second support surface 13b of the support plate 13. The guiding rod 42 and the rack 634 are separated with a space therebetween. The one guiding rod 42 has the other end slidably connected with the drive block 633. The guiding rod 42 can support the drive block 633 connected with the siding seat 2, preventing the sliding seat 2 from tilting due to uneven stress applied to the drive block 633 by the sliding seat 2, and preventing the sliding seat 2 from tilting; tilting of the sliding seat 2 will result in lower stability and accuracy of sliding of the sliding seat 2, which prevents the sliding seat 2 from moving out of the accommodating groove 12d and retracting into the accommodating groove 12d smoothly during sliding and thus causes the sliding seat 2 to collide with a groove-wall of the accommodating groove 12d. Therefore, the present scheme can improve reliability of the electronic device 200.

It can be understood that, although the drive block 633 according to Implementation 2 of the disclosure has a structure different from the drive block 33 according to Implementation 1 of the disclosure, the manner in which the drive block 633 is connected with the sliding seat 2 can refer to related part in the implementations of the disclosure and will not be repeated herein.

As illustrated in FIG. 9, the electronic device 200 switches to the extending-state from the retracting-state as follows. When the motor 631 rotates, the gear 632 rotates and drives the drive block 633 to slide towards the top wall 12a of the frame 1, thereby driving the sliding seat 2 to extend gradually from the accommodating groove 12d until the electronic device 200 is in the extending-state. In this process, since degree of freedom of the drive block 633 and degree of freedom of the sliding seat 2 in the Z-direction are not restricted, the sliding seat 2 can conduct self-adaptive adjustment.

In the above process, the guiding mechanism 4 restricts the sliding seat 2 to a pre-determined direction.

As illustrated in FIG. 10, the electronic device 200 switches to the retracting-state from the extending-state as follows. When the motor 631 rotates, the gear 632 rotates and drives the drive block 633 to slide away from the top wall 12a of the frame 1, thereby driving the sliding seat 2 retract gradually into the accommodating groove 12d until the electronic device 200 is in the retracting-state. In this process, since the degree of freedom of the drive block 633 and the degree of freedom of the sliding seat 2 in the Z-direction are not restricted, the sliding seat 2 can conduct self-adaptive adjustment.

In the above process, the guiding mechanism 4 restricts the sliding seat 2 to a pre-determined direction.

Figure 11:
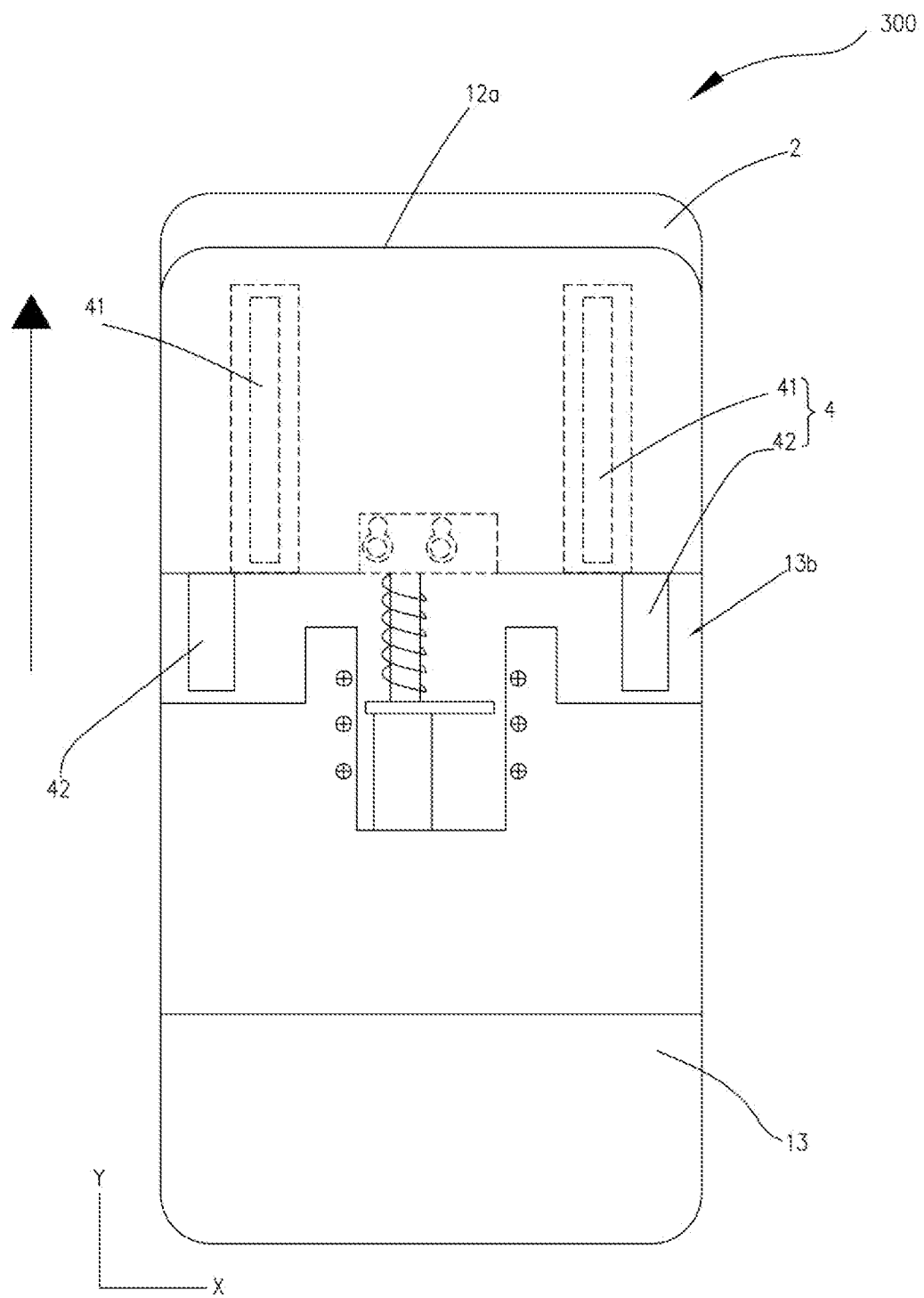
FIG. 11 is a schematic diagram illustrating an arrangement of guiding rods of an electronic device in an extending-state according to Implementation 3 of the present disclosure.

As illustrated in FIG. 11, a structure of an electronic device 300 according to Implementation 3 of the disclosure is similar to the structure of the electronic device 100 according to Implementation 1 of the disclosure. The difference is mainly as follows. The guiding rod 42 includes two guiding rods, that is, two guiding rods 42 are provided. Each of the two guiding rods 42 has one end fixed to the support plate 13 and the other end slidably connected with the sliding seat 2. The drive mechanism 3 is located between the two guiding rods 42.

The guiding rod 42 includes two guiding rods. One of the two guiding rods 42 is located on one side of the drive mechanism 3 and the other one of the two guiding rods 42 is located on the other side of the drive mechanism 3 to guide and support the sliding seat 2, which guarantees that the sliding seat 2, which has a large volume and is guided and supported by the two guiding rods 42, is able to slide steadily and reliably relative to the frame 1.

The sliding seat 2 is provided with two positioning structures. The positioning structure can be a groove or a protrusion to enable the other side of each of the two guiding rods 42 to pass through the groove or the protrusion to be connected with the sliding seat 2.

When the sliding seat 2 slides, the sliding seat 2 slides along the sliding rails 41 of the support plate 13, and at the same time, the two guiding rods 42 guarantee that the sliding seat 2 of large volume provided herein can be further supported and guided, thereby further improving stability and accuracy of sliding of the sliding seat 2.

It can be understood that, the guiding mechanism 4 can also be applicable to the electronic device 200 according to Implementation 2 of the disclosure, which will not be repeated herein.

It can be understood that, a structure of the sliding seat 2 according to Implementation 1, Implementation 2, and Implementation 3 of the disclosure includes but is not limited to the following.

Figure 12:
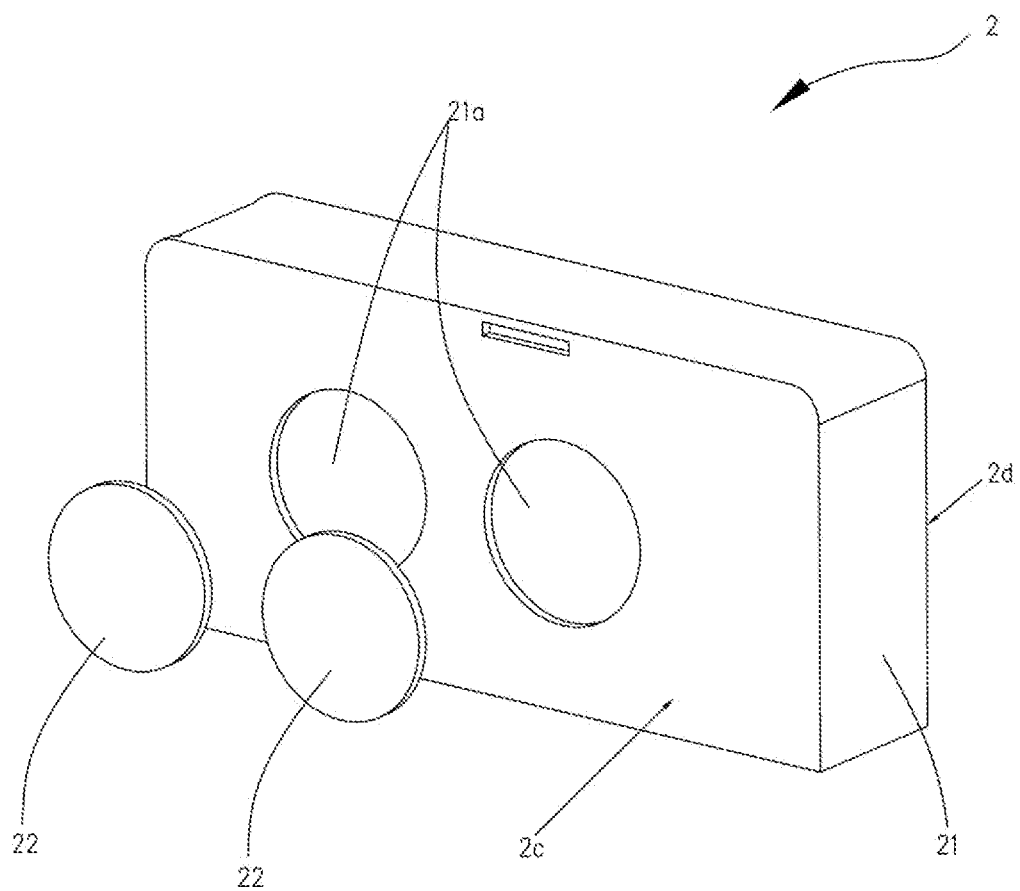
FIG. 12 is a schematic diagram illustrating a sliding seat according to an implementation of the present disclosure.

In one implementation, as illustrated in FIG. 12, the sliding seat 2 has a body 21 and at least one light-transmitting plate 22. The body 21 defines at least one functional hole 21a. One of the at least one light-transmitting plate 22 is disposed in one of the at least one functional hole 21a to form one of the at least one functional portion 5a.

The sliding seat 2 thus structured is partially provided with the functional portion 5a (such as the light-transmitting plate 22 or a hole), which results in low cost. In addition, most part of the sliding seat 2 is made of metal and is therefore of high strength.

Figure 13:
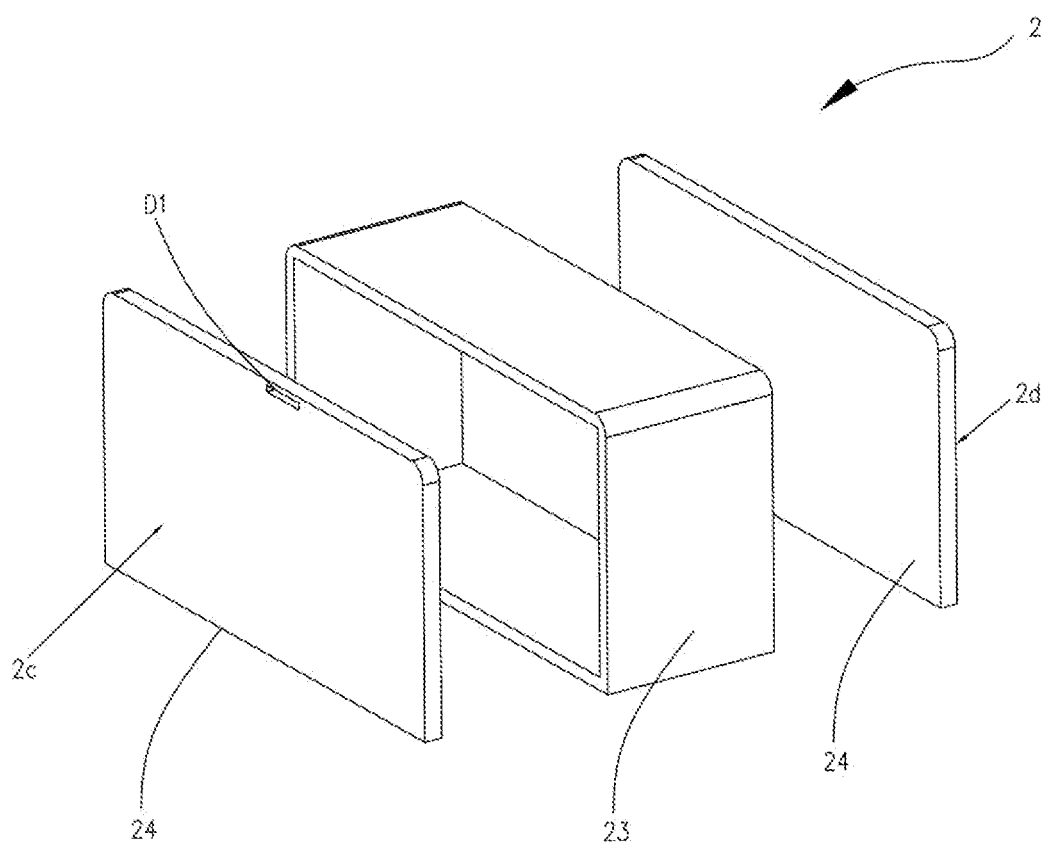
FIG. 13 is a schematic diagram illustrating another sliding seat according to an implementation of the present disclosure.

In another implementation, as illustrated in FIG. 13, the sliding seat 2 includes a sliding frame 23 and two sliding plates 24. The sliding frame 23 is made of a conductive material. One sliding plate 24 covers one side of the sliding frame 23 and the other sliding plate 24 covers the other side of the sliding frame 23 to define an inner cavity of the sliding seat 2 to accommodate the multiple functional components 5. The two sliding plates 24 are made of a light-transmitting material to form the at least one functional portion 5a.

The first sliding surface 2c and the second sliding surface 2d of the sliding seat 2 are both made of glass. Since the first sliding surface 2c and the second sliding surface 2d are both made of glass, the first sliding surface 2c and the second sliding surface 2d can function as a light-transmitting functional portion 5a. When the camera assembly 51 or a light sensor of the sliding seat 2 is needed to work, as long as the sliding seat 2 is moved out of the accommodating groove 12d, light from outside can be transmitted through the first sliding surface 2c or the second sliding surface 2d, thereby ensuring that the camera assembly 51 or the light sensor can work reliably.

It can be understood that, when the functional component 5 of the sliding seat 2 is needed to transmit a sound signal, a first receiving hole D1 is defined in a position corresponding to a receiver 52 on the sliding seat 2 to achieve transmission of the sound signal.

The sliding seat 2 of such structure has two surfaces made of glass, which facilitates light transmission of the multiple functional components 5 of the sliding seat 2 without providing the at least one functional portion 5a in corresponding positions.

It can be understood that, a structure of the multiple functional components 5 according to Implementation 1, Implementation 2, and Implementation 3 of the disclosure can be configured as but not limited to the following.

As illustrated in FIG. 1 and FIG. 2, the electronic device 100 further includes a display module 7. The display module 7 covers the frame 1 and is disposed opposite the sliding seat 2.

The display module 7 covers the side frame member 12 to form a complete housing of the electronic device 100 and is carried on the first support surface 13a of the support plate 13.

The display module 7 can be configured to display an electronic signal, and can be configured to receive an electronic signal input by touch. In other words, the display module 7 is a touch display screen.

Since the multiple functional components 5 are accommodated in the sliding seat 2, when the sliding seat 2 slide relative to the frame 1, the multiple functional components 5 can move out when they are needed to work, thereby avoiding restriction of use of the multiple functional components 5 on the screen-to-body ratio of the display screen of the electronic device 100, which is beneficial to improving the screen-to-body ratio of the electronic device 100.

It can be understood that, the structure of the multiple functional components 5 according to Implementation 1, Implementation 2, and Implementation 3 of the disclosure includes but is not limited to the following.

Figure 14:
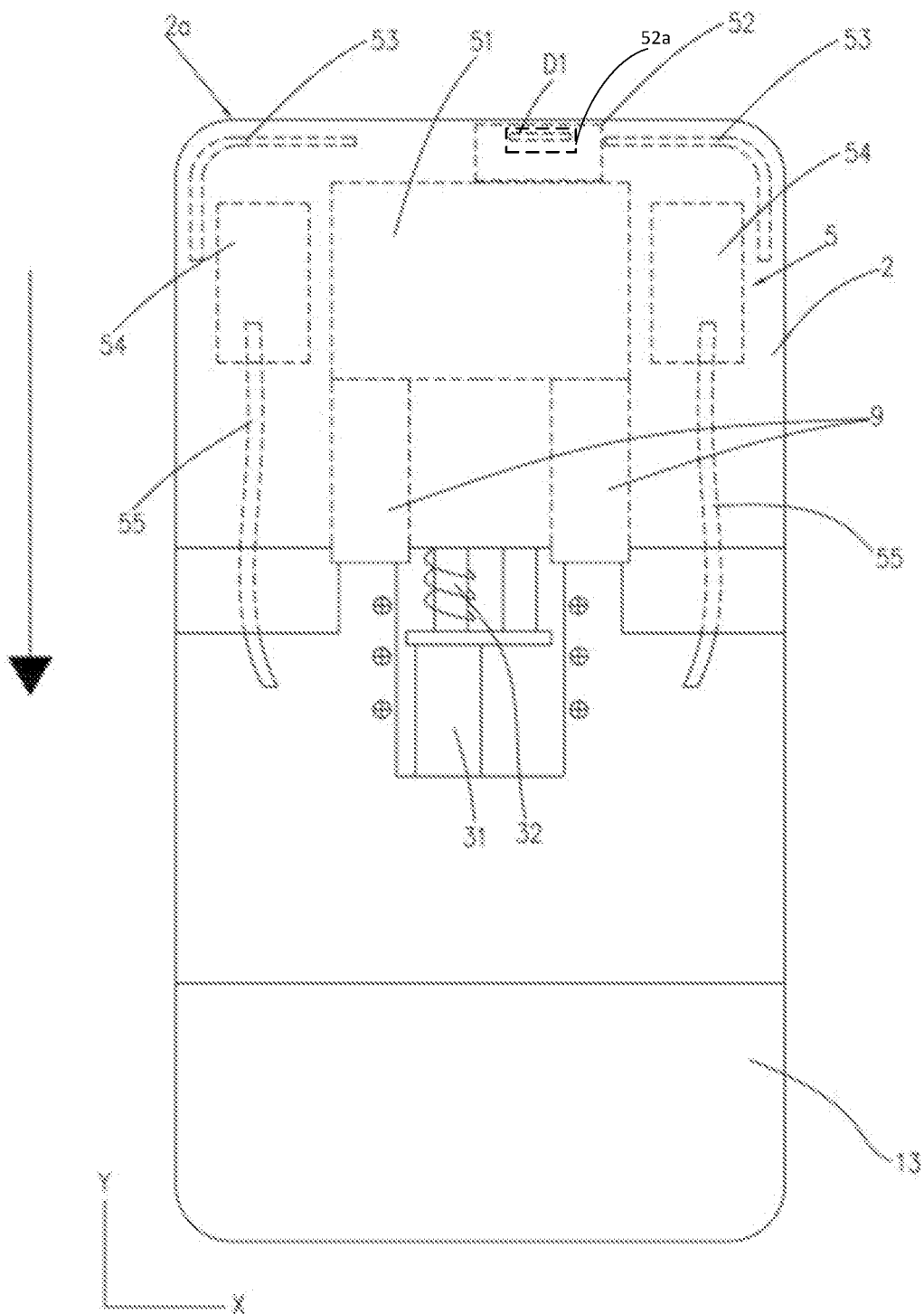
FIG. 14 is a schematic diagram illustrating an arrangement of functional components of a sliding seat of an electronic device in a retracting-state according to an implementation of the present disclosure.

As illustrated in FIG. 14, the electronic device 100 further includes a mainboard 8. The mainboard 8 is carried on the support plate 13 and has a receiving portion 8a. The drive mechanism 3 is located in the receiving portion 8a.

The mainboard 8 is carried on the second support surface 13b of the support plate 13. Part of the mainboard 8 adjacent to the second wall 2b of the sliding seat 2 is hollowed out to define the receiving portion 8a. The receiving portion 8a is configured to receive the drive mechanism 3 or the drive mechanism 63. That is to say, the drive mechanism 3 or the drive mechanism 63 is directly fixed to the support plate 13 rather than disposed on the mainboard 8, which decreases the size of the electronic device 100 in the Z-direction.

It can be understood that, the structure of the multiple functional components 5 according to Implementation 1, Implementation 2, and Implementation 3 of the disclosure includes but is not limited to the following.

Figure 15:
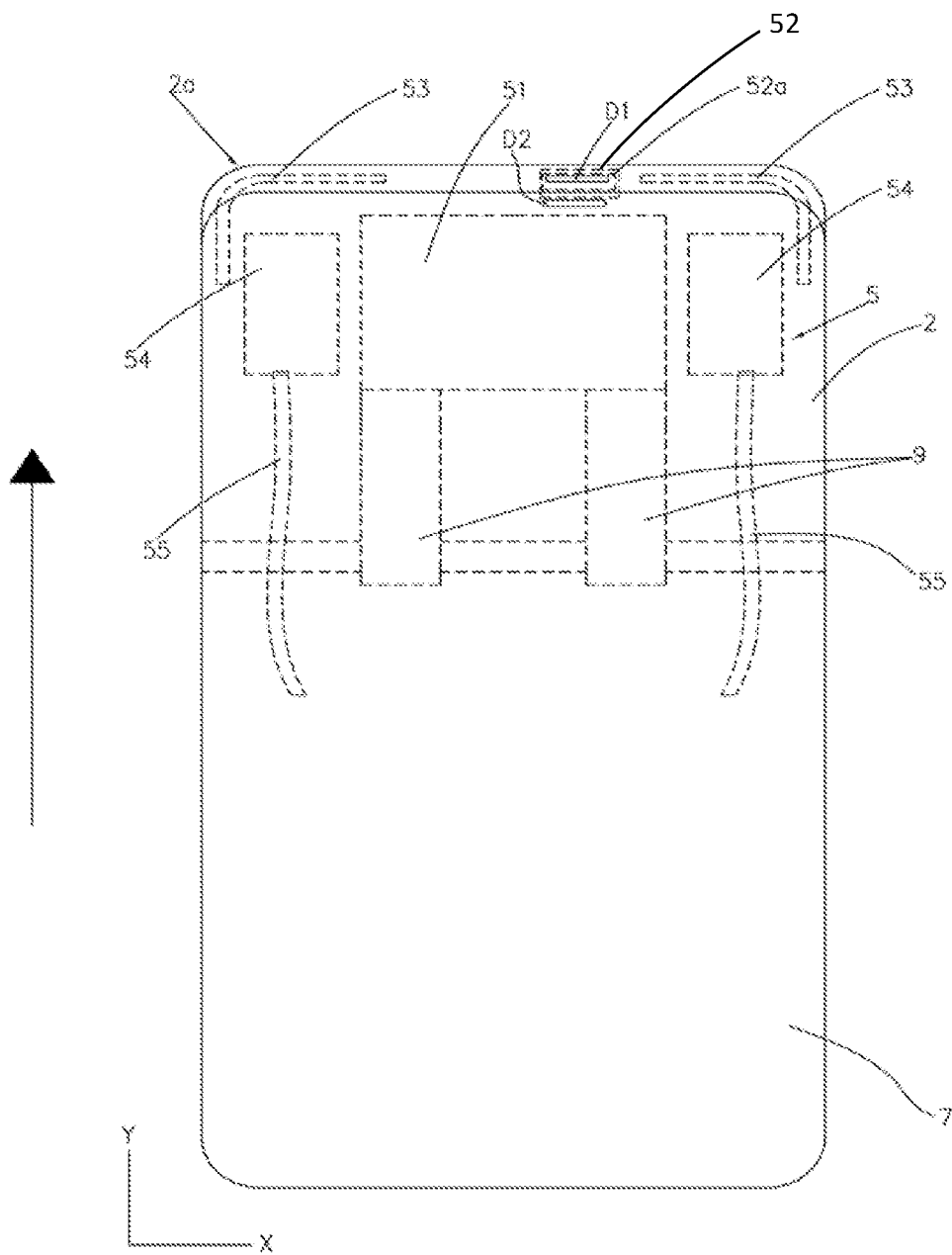
FIG. 15 is a schematic diagram illustrating the electronic device of FIG. 14 in an extending-state.

In one implementation, as illustrated in FIG. 14 and FIG. 15, the electronic device 100 further includes a flexible electrical connector 9. The flexible electrical connector 9 has one end located in the sliding seat 2 and electrically connected with the multiple functional components 5. The flexible electrical connector 9 has the other end extending from the sliding seat 2 to be electrically connected with the mainboard 8 of the frame 1.

The multiple functional components 5 of the sliding seat 2 are electrically connected with the mainboard 8 of the frame 1 via the flexible electrical connector 9, as such, when the sliding seat 2 slides, electrical signals of the multiple functional components 5 will not be interrupted and the multiple functional components 5 can still work normally, thereby further improving reliability of the electronic device 100.

It can be understood that, the flexible electrical connector 9 is a winding flexible circuit board. When the sliding seat 2 slides, the flexible electrical connector 9 extends or winds. In other implementations, the flexible electrical connector 9 can be a cable.

The flexible electrical connector 9 is embodied as a winding flexible circuit board to make the flexible electrical connector 9 deform with different states of the sliding seat 2, that is, when the flexible electrical connector 9 winds, the flexible electrical connector 9 occupies only a small area.

Referring to FIG. 15, when the sliding seat 2 is in an extending-state, the flexible electrical connector 9 is extended to the longest. Referring to FIG. 14, when the sliding seat 2 is in a retracting-state, the flexible electrical connector 9 winds in a roll and thus occupies less space of the electronic device 100.

It can be understood that, as illustrated in FIG. 14, the multiple functional components 5 further includes a camera assembly 51 and a receiver 52, and both the camera assembly 51 and the receiver 52 are electrically connected with one end of the flexible electrical connector 9.

As illustrated in FIG. 14, the camera assembly 51 and the receiver 52 are disposed side by side. The camera assembly 51 is mainly located in the middle of the sliding seat 2. The receiver 52 is disposed adjacent to the first wall 2a of the sliding seat 2, to achieve sound signal output of the receiver 52 when the first wall 2a of the sliding seat 2 is exposed from the top wall 12a.

Referring to FIG. 14, the flexible electrical connector 9 and the camera assembly 51 are disposed side by side in the Y-direction of the electronic device 100. The flexible electrical connector 9 includes two flexible electrical connectors which are arranged along the X-direction of the electronic device 100. The two flexible electrical connectors 9 are disposed adjacent to the second wall 2b of the sliding seat 2, which enables the two flexible electrical connectors 9 to extend from the sliding seat 2 to be electrically connected with a circuit board of the electronic device 100, thus further optimizing internal space of the electronic device 100.

The camera assembly 51 and the receiver 52 are both electrically connected with the two flexible electrical connectors 9, thereby optimizing arrangement of flexible circuit boards inside the sliding seat 2 and saving space.

It can be understood that, the camera assembly 51 can include but is not limited to the following: at least one of a front-facing camera assembly, a rear assembly, and a flashlight.

In addition, as illustrated in FIG. 14 and FIG. 15, the multiple functional components 5 further include a radiating body 53 of an antenna, a secondary circuit board 54, and a cable 55. The radiating body 53 is disposed adjacent to an edge of the sliding seat 2. The radiating body 53 is electrically coupled with one end of the cable 55 via the secondary circuit board 54, to enable transmission and reception of signals. The cable 55 has the other end extending from the sliding seat 2 to be electrically connected with the mainboard 8 of the frame 1. It is understood, the radiating body 53 is a part of the antenna, and, besides the radiating body 53, the antenna further includes circuits disposed on the mainboard.

The radiating body 53 is electrically coupled with the mainboard 8 via the cable 55 rather than via the flexible electrical connector 9, to prevent an electrical signal of the radiating body 53 from being interrupted by other functional components 5, thereby further enhancing radiation of the radiating body 53.

The radiating body 53 is disposed adjacent to the first wall 2a of the sliding seat 2, which decreases probability of occlusion by user's hand when the radiating body 53 radiates signals, thereby ensuring that the radiating body 53 has better radiation performance.

A structure of the cable 55 makes the cable 55 seldom wind or be extended when the sliding seat 2 slides, thereby ensuring transmission of electrical signals between the radiating body 53 and the mainboard 8.

Referring to FIG. 14, the secondary circuit board 54 includes two said secondary circuit boards, and the cable 55 accordingly includes two said cables. One of the two secondary circuit boards 54 is located on one side of the camera assembly 51, and the other one of the two secondary circuit boards 54 is located on the other one side of the camera assembly 51. One of the two secondary circuit boards 54 is provided with a matching circuit electrically connected with the radiating body 53. The cables 55 are electrically connected between the two secondary circuit boards 54 and the mainboard 8.

As illustrated in FIG. 15, the radiating body 53 is disposed in the sliding seat 2. When the sliding seat 2 is in the extending-state, since the radiating body 53 is not occluded by the display screen or a back plate, the radiating body 53 has better radiation performance. Therefore, by sliding the sliding seat 2 out of the accommodating groove 12d, stronger signals can be obtained, if necessary.

In addition, the manner in which a sound signal of the receiver 52 is output includes but is not limited to the following.

In one implementation, as illustrated in FIG. 14, the sliding seat 2 defines a first receiving hole D1. The receiver 52 has a vibration portion 52a communicating with the first receiving hole D1 on the sliding seat 2, whereby a sound signal of the receiver 52 is output through the first receiving hole D1 after the receiver 52 extends from the accommodating groove 12d.

As illustrated in FIG. 13 and FIG. 14, the first receiving hole D1 is defined adjacent to the first wall 2a. The vibration portion 52a of the receiver 52 is sealed and connected with the first receiving hole D1 and vibrates to generate a sound signal. The sound signal is transmitted to the outside through the first receiving hole D1.

It can be understood that, as illustrated in FIG. 14, as long as the first receiving hole D1 is exposed, the sound signal of the receiver 52 can be transmitted to the outside through the first receiving hole D1.

In another implementation, as illustrated in FIG. 15, the sliding seat 2 defines a first receiving hole D1, and the receiver 52 has a vibration portion 52a communicating with the first receiving hole D1, whereby a sound signal of the receiver 52 is output through the first receiving hole D1 after the receiver 52 extends from the accommodating groove 12d. The frame 1 defines a second receiving hole D2. When the sliding seat 2 is accommodated in the accommodating groove 12d, the second receiving hole D2 communicates with the first receiving hole D1, whereby a sound signal of the receiver 52 is output to the second receiving hole D2 through the first receiving hole D1 when the receiver 52 is accommodated in the accommodating groove 12d.

The first receiving hole D1 is defined adjacent to the first wall 2a. The vibration portion 52a of the receiver 52 is sealingly connected with the first receiving hole D1 and vibrates to generate a sound signal. The sound signal is transmitted to the outside through the first receiving hole D1.

The second receiving hole D2 is defined on the top wall 12a to avoid influence on the screen-to-body ratio of the display screen. The second receiving hole D2 communicates with the first receiving hole D1. In this way, when the sliding seat 2 is accommodated in the accommodating groove 12d, the sound signal of the receiver 52 can be transmitted to the second receiving hole D2 through the first receiving hole D1 to realize sound signal output of the receiver 52.

It can be understood that, the multiple functional components 5 can further include but not limited to at least one of a speaker, a microphone, and an infrared sensor.

The electronic device 100 provided herein can make the sliding seat 2 extend from or retract into the frame 1 according to users' actual needs as follows. When one of the multiple functional components 5 is needed to work, the sliding seat 2 can slide to the extending-state accordingly. In this case, one of the at least one functional portion 5a on the sliding seat 2 is no longer occluded by the display screen. Said one of the multiple functional components 5 corresponding to said one of the at least one functional portion 5a is able to transmit a signal to the outside.

In the electronic device 100 provided herein, the multiple functional components 5 are disposed in the sliding seat 2, and the sliding seat 2 can slide relative to the frame 1. In this way, when the multiple functional components 5 are needed to work, the drive mechanism 3 can drive the sliding seat 2 to slide out of the frame 1 to make the at least one functional portion 5a extend from the frame 1 to transmit a signal, that is, there is no need to dispose the at least one functional portion 5a corresponding to the multiple functional components 5 on the display screen of the electronic device 100, which is beneficial to improving the screen-to-body ratio of the electronic device 100. In addition, the guiding mechanism 4 can make the sliding seat 2 keep sliding along a pre-determined path when the sliding seat 2 slides relative to the frame 1, thereby ensuring accuracy and stability of sliding of the sliding seat 2.

Figure 16:
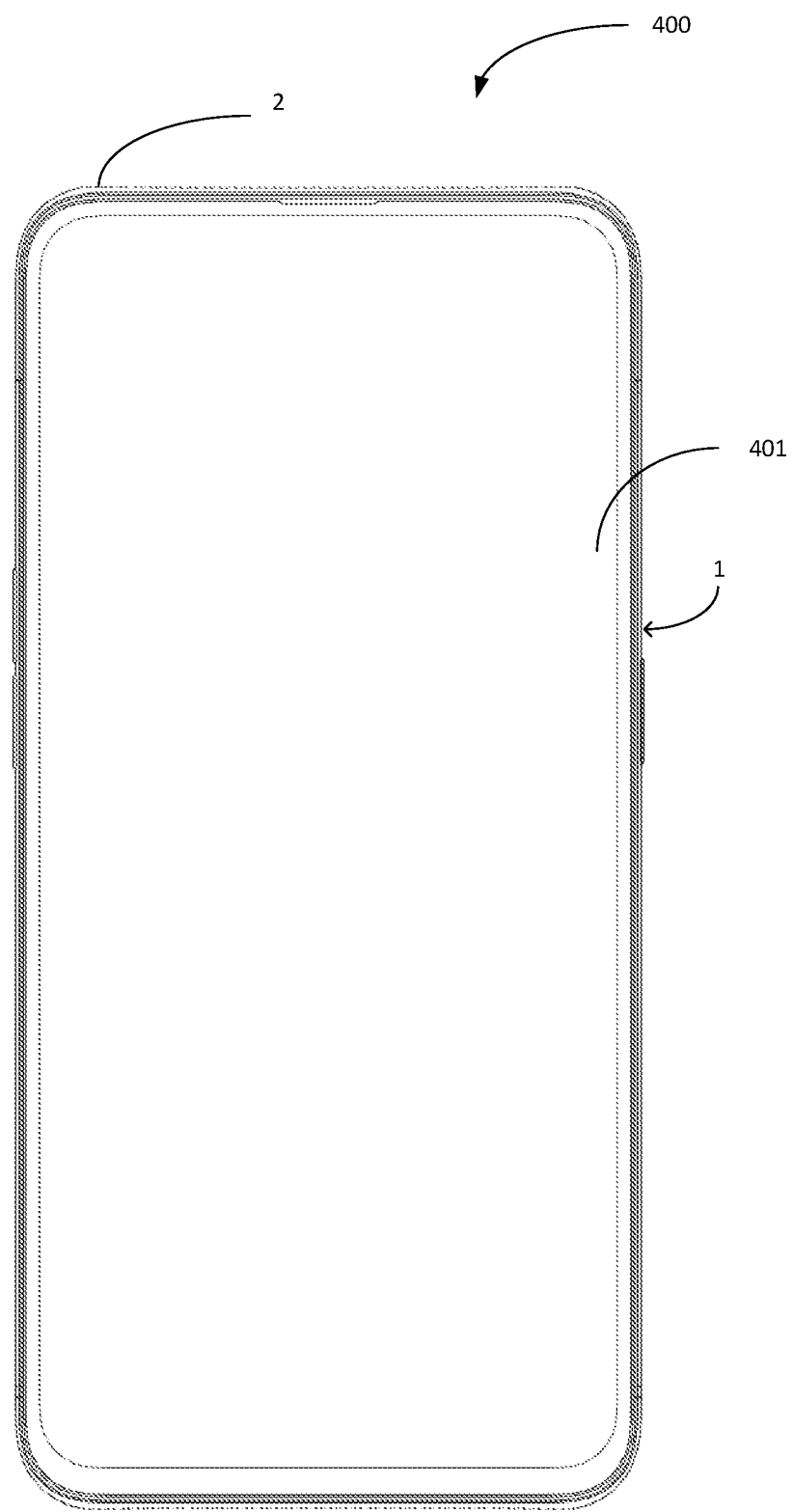
FIG. 16 is a schematic diagram illustrating a terminal device according to an implementation of the disclosure.

FIG. 16 is a schematic diagram illustrating a terminal device 400 according to an implementation of the disclosure. The terminal device 400 includes the electronic device described above and a display module 401. The display module 401 covers the frame 1 and is disposed opposite the sliding seat 2. For details not revealed, reference can be made to the description in the foregoing implementations and the disclosure will not be repeated herein.

Figure 17:
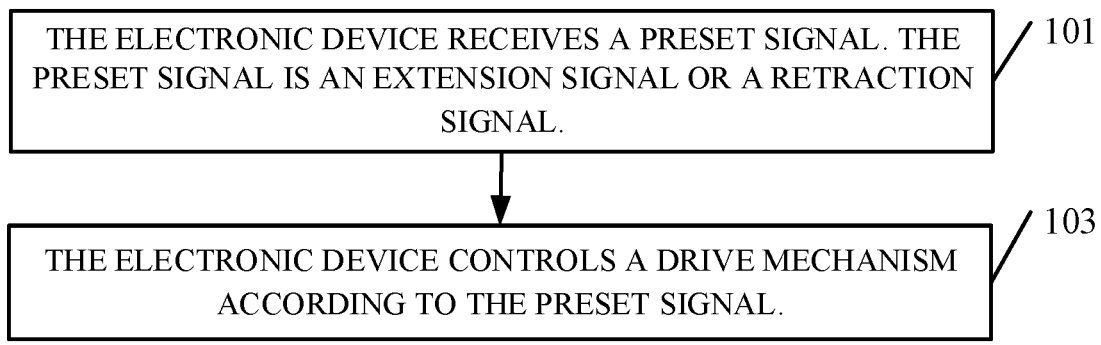
FIG. 17 is a schematic flowchart illustrating a method for controlling an electronic device according to an implementation of the present disclosure.

FIG. 17 is a schematic flowchart illustrating a method for controlling an electronic device according to an implementation of the present disclosure. The method can be applicable to but is not limited to the electronic device of Implementation 1, the electronic device of Implementation 2, and the electronic device of Implementation 3 described above. The method includes the following.

At 101, the electronic device receives a preset signal. The preset signal is an extension signal or a retraction signal. The extension signal is configured to indicate a sliding seat to extend from an accommodating groove. The retraction signal is configured to indicate the sliding seat to retract into the accommodating groove.

At 103, the electronic device controls a drive mechanism according to the preset signal.

The electronic device controls the drive mechanism according to the preset signal as follows. When the preset signal is the extension signal, the electronic device controls, according to the preset signal, the drive mechanism to drive the sliding seat to extend from the accommodating groove along a guiding direction of a guiding mechanism. When the preset signal is the retraction signal, the electronic device controls, according to the preset signal, the drive mechanism to drive the sliding seat to retract into the accommodating groove along the guiding direction of the guiding mechanism.

It can be understood that, the extension signal or the retraction signal received by the electronic device can be input through voice, text, touch, etc. by a user. After the electronic device receives the extension signal, the electronic device will be in an extending-state.

The method is applicable to the above electronic device which is beneficial to improving the screen-to-body ratio of the electronic device. In addition, the guiding mechanism is able to make the sliding seat keep sliding along a pre-determined path when the sliding set slides relative to the frame, thereby ensuring accuracy and stability during sliding of the sliding seat.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An electronic device, comprising a frame, a sliding seat, a guiding mechanism, a drive mechanism, and a plurality of functional components, the plurality of functional components being accommodated in the sliding seat;
   the frame comprising a pair of side walls oppositely disposed and a top wall, the top wall defining an accommodating groove, and the accommodating groove extending through the pair of side walls;
   the sliding seat being slidably connected with the frame in the accommodating groove via the drive mechanism, and the guiding mechanism being disposed between the sliding seat and the frame, wherein the sliding seat driven by the drive mechanism extends from or is accommodated in the accommodating groove along a guiding direction of the guiding mechanism; the sliding seat being provided with at least one functional portion, wherein the plurality of functional components are able to transmit a signal through the at least one functional portion;
   a support plate covering the frame; and
   the guiding mechanism comprising:
      at least one sliding rail disposed on the support plate, wherein the sliding seat is slidably connected with the at least one sliding rail; and
      a guiding rod, having one end fixed in the frame and the other end slidable relative to the sliding seat; the guiding rod extending in a longitudinal direction parallel to a longitudinal direction of the sliding rail;
   wherein the electronic device is provided with one said guiding rod, and the one guiding rod is disposed adjacent to the drive mechanism and has one end fixed to the drive mechanism;
   wherein the drive mechanism comprises a motor, a gear, a rack, and a drive block, and the motor, the gear, the rack, and the drive block are fixed to the support plate, wherein the gear is sleeved on a rotating shaft of the motor, the rack is engaged with the gear, the rack is slidable in the longitudinal direction of the sliding rail, the drive block is disposed between the rack and the sliding seat to make the drive block drive the sliding seat to slide when the rack slides, and the one guiding rod has one end fixed to the motor and the other end slidably connected with the drive block, or the drive mechanism comprises a motor, an active rod, and a drive block, and the motor, the active rod, and the drive block are fixed to the frame, wherein the active rod has one end fixedly connected with a rotating shaft of the motor, the drive block is in a driving connection with the active rod and is connected with the sliding seat to make the drive block drive the sliding seat to slide when the motor rotates, and the one guiding rod has one end fixed to the motor and the other end slidably connected with the drive block; and
   wherein the sliding seat defines at least one connecting hole and the drive mechanism further comprises at least one connecting rod, wherein the at least one connecting rod has one end fixed to the drive block and the other end passing through the connecting hole of the sliding seat, and a central axis of the connecting rod is perpendicular to the support plate to make the sliding seat slide relative to the connecting rod.

2. The electronic device of claim 1, further comprising a buffer member, wherein the buffer member is located in the connecting hole and abuts against a hole-wall of the connecting hole and the connecting rod, and the buffer member is configured to absorb at least part of force transmitted to the drive mechanism from the sliding seat when the sliding seat is subject to an external force.

3. The electronic device of claim 2, wherein
the buffer member is made of rubber and is sleeved on part of the connecting rod located in the connecting hole; or
the buffer member is a spring and an elastic force of the buffer member is parallel to an extending direction of the sliding seat.

4. The electronic device of claim 1, wherein the sliding seat comprises a sliding frame and two sliding plates, wherein the sliding frame is made of a conductive material, one sliding plate covers one side of the sliding frame and the other sliding plate covers the other side of the sliding frame to define an inner cavity of the sliding seat to accommodate the plurality of functional components, and the two sliding plates are made of a light-transmitting material to form the at least one functional portion.

5. The electronic device of claim 1, wherein the sliding seat has a body and at least one light-transmitting plate, wherein the body defines at least one functional hole, and one of the at least one light-transmitting plate is disposed in one of the at least one functional hole to form one of the at least one functional portion.

6. The electronic device of claim 1, further comprising a flexible electrical connector, wherein the flexible electrical connector has one end located in the sliding seat and electrically connected with the plurality of functional components, and the flexible electrical connector has the other end extending from the sliding seat to be electrically connected with a mainboard of the frame.

7. The electronic device of claim 6, wherein the flexible electrical connector is a winding flexible circuit board, and the flexible electrical connector extends or winds when the sliding seat slides.

8. The electronic device of claim 7, wherein the plurality of functional components further comprises a camera assembly and a receiver, and the camera assembly and the receiver are electrically connected with one end of the flexible electrical connector.

9. The electronic device of claim 8, wherein the sliding seat defines a first receiving hole, and the receiver communicates with the first receiving hole on the sliding seat, wherein a sound signal of the receiver is output through the first receiving hole after the receiver extends from the accommodating groove.

10. The electronic device of claim 9, wherein the frame defines a second receiving hole, and the second receiving hole communicates with the first receiving hole when the sliding seat is accommodated in the accommodating groove, wherein a sound signal of the receiver is output to the second receiving hole through the first receiving hole when the receiver is accommodated in the accommodating groove.

11. The electronic device of claim 6, wherein the plurality of functional components further comprises a radiating body of an antenna, a secondary circuit board, and a cable, wherein the radiating body is disposed adjacent to an edge of the sliding seat and is electrically coupled with one end of the cable via the secondary circuit board, and the cable has the other end extending from the sliding seat to be electrically connected with the mainboard of the frame.

12. A terminal device, comprising an electronic device and a display module,
the electronic device comprising a frame, a sliding seat, a guiding mechanism, a drive mechanism, a support plate covering the frame, and a plurality of functional components, the plurality of functional components being accommodated in the sliding seat;
the frame comprising a pair of side walls oppositely disposed and a top wall connected between the pair of side walls' end-surfaces, the top wall defining an accommodating groove, and the accommodating groove extending through the pair of side walls;
the sliding seat being slidably connected with the frame in the accommodating groove via the drive mechanism, and the guiding mechanism being disposed between the sliding seat and the frame, wherein the sliding seat driven by the drive mechanism extends from or is accommodated in the accommodating groove along a guiding direction of the guiding mechanism; the sliding seat being provided with at least one functional portion, wherein the plurality of functional components is able to transmit a signal through the at least one functional portion; and
the display module covering the frame and being disposed opposite the sliding seat;
wherein the guiding mechanism comprises at least one sliding rail disposed on the support plate, wherein the sliding seat is slidably connected with the at least one sliding rail; and a guiding rod, having one end fixed in the frame and the other end slidable relative to the sliding seat; the guiding rod extending in a longitudinal direction parallel to a longitudinal direction of the sliding rail;
wherein the electronic device is provided with one said guiding rod, and the one guiding rod is disposed adjacent to the drive mechanism and has one end fixed to the drive mechanism;
wherein the drive mechanism comprises a motor, a gear, a rack, and a drive block, and the motor, the gear, the rack, and the drive block are fixed to the support plate, wherein the gear is sleeved on a rotating shaft of the motor, the rack is engaged with the gear, the rack is slidable in the longitudinal direction of the sliding rail, the drive block is disposed between the rack and the sliding seat to make the drive block drive the sliding seat to slide when the rack slides, and the one guiding rod has one end fixed to the motor and the other end slidably connected with the drive block, or the drive mechanism comprises a motor, an active rod, and a drive block, and the motor, the active rod, and the drive block are fixed to the frame, wherein the active rod has one end fixedly connected with a rotating shaft of the motor, the drive block is in a driving connection with the active rod and is connected with the sliding seat to make the drive block drive the sliding seat to slide when the motor rotates, and the one guiding rod has one end fixed to the motor and the other end slidably connected with the drive block; and
wherein the sliding seat defines at least one connecting hole and the drive mechanism further comprises at least one connecting rod, wherein the at least one connecting rod has one end fixed to a drive block and the other end passing through the connecting hole of the sliding seat, and a central axis of the connecting rod is perpendicular to a support plate to make the sliding seat slide relative to the connecting rod.

13. A method for controlling an electronic device, applicable to an electronic device comprising a frame, a sliding seat, a guiding mechanism, a drive mechanism, a support plate covering the frame, and a plurality of functional components, the plurality of functional components being accommodated in the sliding seat; the frame comprising a pair of side walls oppositely disposed and a top wall, the top wall defining an accommodating groove, and the accommodating groove extending through the pair of side walls; the sliding seat being slidably connected with the frame in the accommodating groove via the drive mechanism, and the guiding mechanism being disposed between the sliding seat and the frame, whereby the sliding seat driven by the drive mechanism extends from or is accommodated in the accommodating groove along a guiding direction of the guiding mechanism; the sliding seat being provided with at least one functional portion, whereby the plurality of functional components are able to transmit a signal through the at least one functional portion, wherein the guiding mechanism comprises at least one sliding rail disposed on the support plate and a guiding rod, having one end fixed in the frame and the other end slidable relative to the sliding seat, wherein the sliding seat is slidably connected with the at least one sliding rail, wherein the guiding rod extends in a longitudinal direction parallel to a longitudinal direction of the sliding rail, wherein the electronic device is provided with one said guiding rod, and the one guiding rod is disposed adjacent to the drive mechanism and has one end fixed to the drive mechanism, wherein the drive mechanism comprises a motor, a gear, a rack, and a drive block, and the motor, the gear, the rack, and the drive block are fixed to the support plate, wherein the gear is sleeved on a rotating shaft of the motor, the rack is engaged with the gear, the rack is slidable in the longitudinal direction of the sliding rail, the drive block is disposed between the rack and the sliding seat to make the drive block drive the sliding seat to slide when the rack slides, and the one guiding rod has one end fixed to the motor and the other end slidably connected with the drive block, or the drive mechanism comprises a motor, an active rod, and a drive block, and the motor the active rod and the drive block are fixed to the frame wherein the active rod has one end fixedly connected with a rotating shaft of the motor, the drive block is in a driving connection with the active rod and is connected with the sliding seat to make the drive block drive the sliding seat to slide when the motor rotates, and the one guiding rod has one end fixed to the motor and the other end slidably connected with the drive block, and wherein the sliding seat defines at least one connecting hole and the drive mechanism further comprises at least one connecting rod, wherein the at least one connecting rod has one end fixed to a drive block and the other end passing through the connecting hole of the sliding seat, and a central axis of the connecting rod is perpendicular to a support plate to make the sliding seat slide relative to the connecting rod;

the method comprising:
receiving, by the electronic device, a preset signal, wherein the preset signal is an extension signal or a retraction signal;
controlling, by the electronic device, the drive mechanism to drive the sliding seat to extend from the accommodating groove along the guiding direction of the guiding mechanism according to the preset signal, when the preset signal is the extension signal; and
controlling, by the electronic device, the drive mechanism to drive the sliding seat to retract into the accommodating groove along the guiding direction of the guiding mechanism according to the preset signal, when the preset signal is the retraction signal.

* * * * *